(12) United States Patent
Jeong et al.

(10) Patent No.: US 12,315,986 B2
(45) Date of Patent: May 27, 2025

(54) ANTENNA AND DEVICE CONFIGURATIONS

(71) Applicant: QUALCOMM Incorporated, San Diego, CA (US)

(72) Inventors: Seong Heon Jeong, Tuscaloosa, AL (US); Rajneesh Kumar, San Diego, CA (US); Mohammad Ali Tassoudji, San Diego, CA (US); Darryl Jessie, San Diego, CA (US); Gurkanwal Sahota, San Diego, CA (US); Kevin Hsi Huai Wang, San Diego, CA (US); Jeong Il Kim, San Diego, CA (US); Taesik Yang, San Diego, CA (US); Thomas Myers, San Diego, CA (US); Neil Burns, San Diego, CA (US); Julio Zegarra, La Jolla, CA (US); Clinton James Wilber, San Diego, CA (US); Jordan Szabo, Carlsbad, CA (US)

(73) Assignee: QUALCOMM Incorporated, San Diego, CA (US)

( * ) Notice: Subject to any disclaimer, the term of this patent is extended or adjusted under 35 U.S.C. 154(b) by 521 days.

(21) Appl. No.: 17/666,549

(22) Filed: Feb. 7, 2022

(65) Prior Publication Data
US 2022/0166127 A1 May 26, 2022

Related U.S. Application Data

(63) Continuation of application No. 16/145,100, filed on Sep. 27, 2018, now Pat. No. 11,245,175.
(Continued)

(51) Int. Cl.
*H01Q 1/22* (2006.01)
*H01L 23/28* (2006.01)
(Continued)

(52) U.S. Cl.
CPC .......... *H01Q 1/2283* (2013.01); *H01L 23/28* (2013.01); *H01L 23/552* (2013.01);
(Continued)

(58) Field of Classification Search
CPC .......... H01Q 21/28; H01Q 9/26; H01Q 9/065; H01Q 9/0407; H01Q 1/526; H01Q 1/243; H01Q 1/2283
See application file for complete search history.

(56) References Cited

U.S. PATENT DOCUMENTS

| 7,965,191 B2 | 6/2011 | Rofougaran |
| 9,619,743 B1 | 4/2017 | Yan et al. |

(Continued)

FOREIGN PATENT DOCUMENTS

| CN | 101118890 A | 2/2008 |
| CN | 102496759 A | 6/2012 |

(Continued)

OTHER PUBLICATIONS

European Search Report—23183255.1—Search Authority—The Hague—Oct. 17, 2023.
(Continued)

*Primary Examiner* — Graham P Smith
(74) *Attorney, Agent, or Firm* — Seyfarth Shaw LLP/Qualcomm Incorporated

(57) ABSTRACT

An antenna module is described. The antenna module include a ground plane in a multilayer substrate. The antenna module also includes a mold on the multilayer substrate. The antenna module further includes a conductive wall separating a first portion of the mold from a second portion of the mold. The conductive wall is electrically coupled to the ground plane. A conformal shield may be placed on a surface of the second portion of the mold. The conformal shield is electrically coupled to the ground plane.

20 Claims, 14 Drawing Sheets

Related U.S. Application Data

(60) Provisional application No. 62/566,318, filed on Sep. 30, 2017, provisional application No. 62/688,995, filed on Jun. 22, 2018, provisional application No. 62/586,839, filed on Nov. 15, 2017.

(51) Int. Cl.

| | | |
|---|---|---|
| *H01L 23/552* | (2006.01) | |
| *H01L 23/64* | (2006.01) | |
| *H01L 23/66* | (2006.01) | |
| *H01L 25/065* | (2023.01) | |
| *H01Q 1/24* | (2006.01) | |
| *H01Q 1/52* | (2006.01) | |
| *H01L 23/31* | (2006.01) | |
| *H01Q 9/04* | (2006.01) | |
| *H01Q 9/06* | (2006.01) | |
| *H01Q 9/26* | (2006.01) | |
| *H01Q 21/28* | (2006.01) | |

(52) U.S. Cl.
CPC ............ *H01L 23/645* (2013.01); *H01L 23/66* (2013.01); *H01L 25/0655* (2013.01); *H01Q 1/243* (2013.01); *H01Q 1/526* (2013.01); *H01L 23/3121* (2013.01); *H01L 2223/6677* (2013.01); *H01L 2224/16225* (2013.01); *H01Q 9/0407* (2013.01); *H01Q 9/065* (2013.01); *H01Q 9/26* (2013.01); *H01Q 21/28* (2013.01)

(56) References Cited

U.S. PATENT DOCUMENTS

| | | | |
|---|---|---|---|
| 9,905,922 B2 | 2/2018 | Lee et al. | |
| 10,205,224 B2 | 2/2019 | Mow et al. | |
| 10,381,730 B2 | 8/2019 | Gu et al. | |
| 10,944,181 B2 | 3/2021 | Takayama et al. | |
| 11,245,175 B2 | 2/2022 | Jeong et al. | |
| 2010/0240327 A1* | 9/2010 | Lambrecht | H01Q 1/243 343/702 |
| 2013/0099981 A1 | 4/2013 | Vortmeier et al. | |
| 2013/0225102 A1 | 8/2013 | Tsutsumi et al. | |
| 2013/0292808 A1 | 11/2013 | Yen et al. | |
| 2016/0308563 A1 | 10/2016 | Ouyang et al. | |
| 2017/0181287 A1 | 6/2017 | Jhang et al. | |
| 2017/0214121 A1 | 7/2017 | Ganchrow et al. | |
| 2018/0062263 A1 | 3/2018 | Ueda | |
| 2018/0254555 A1 | 9/2018 | Sotoma et al. | |

FOREIGN PATENT DOCUMENTS

| | | |
|---|---|---|
| CN | 102842769 A | 12/2012 |
| CN | 103367269 A | 10/2013 |
| CN | 106340721 A | 1/2017 |
| CN | 106471671 A | 3/2017 |
| CN | 108448230 A | 8/2018 |
| DE | 202017003830 U1 | 11/2017 |
| EP | 3051625 B1 | 7/2017 |
| WO | 2017111766 A1 | 6/2017 |
| WO | 2017111767 A1 | 6/2017 |

OTHER PUBLICATIONS

Helander J., et al., "Performance Analysis of Millimeter-Wave Phased Array Antennas in Cellular Handsets", IEEE Antennas and Wireless Propagation Letters, vol. 15, 2016, pp. 504-507.

Hong W., et al., "Millimeter-Wave 5G Antennas for Smartphones: Overview and Experimental Demonstration", IEEE Transactions on Antennas and Propagation, Dec. 2017, vol. 65, No. 12, pp. 6250-6261.

Khalily M., et al., "Design of Phased Arrays of Series-Fed Patch Antennas with Reduced Number of the Controllers for 28-GHz mm-Wave Applications", IEEE Antennas and Wireless Propagation Letters, vol. 15, 2016, 5 Pages.

Psychoudakis D., et al., "Mobile Station Radio Frequency Unit for 5G Communications at 28GHz", IEEE, 2016, 3 Pages.

Sony., et al., "UE Antenna Array Configuration for mmWave 28GHz", R4-1704864, 3GPP TSG-RAN WG4 Meeting #83, Hangzhou, China May 15-19, 2017, 6 Pages.

International Search Report and Written Opinion—PCT/US2018/053585—ISA/EPO—Jan. 23, 2019.

\* cited by examiner

ANTENNA AND DEVICE CONFIGURATIONS

CROSS-REFERENCE TO RELATED APPLICATIONS

The present application is a continuation of U.S. patent application Ser. No. 16/145,100, filed on Sep. 27, 2018, and titled "ANTENNA MODULE CONFIGURATIONS," now issued as U.S. Pat. No. 11,245,175, which claims the benefit of U.S. Provisional Patent Application No. 62/566,318, filed on Sep. 30, 2017, and titled "ANTENNA CONFIGURATIONS" and U.S. Provisional Patent Application No. 62/688,995, filed on Jun. 22, 2018, and titled "METHOD AND APPARATUS TO INTEGRATE A MOLD INTO AN ANTENNA PACKAGE," the disclosures of which are expressly incorporated by reference herein in their entireties. U.S. patent application Ser. No. 16/145,100 further claims the benefit of U.S. Provisional Patent Application No. 62/586,839, filed on Nov. 15, 2017, and titled "ANTENNA CONFIGURATIONS."

BACKGROUND

Field

The present disclosure relates generally to wireless communication, and more particularly, to antenna module configurations.

Background

Wireless communications may be transmitted over a multitude of different frequencies and bands. For example, communications may be transmitted using a millimeter wave (mmW) signal, for example, somewhere in the 24-60 gigahertz (GHz) range or higher. Such communications are, in some circumstances, transmitted with a large bandwidth. The large bandwidth enables wireless transmission of a high volume of information. As a result, multiple applications specifying transmission of large amounts of data can be developed using wireless communications having a wavelength in the millimeter range.

Facilitating mmW applications involves developing circuits and antennas that operate in these frequency ranges. The various modules and circuits may be fabricated and packaged in any number of ways. The size of these circuits may vary.

In the consumer electronics market, the design of electronic devices, including the integrated RF components, is generally dictated by cost, size, and weight, as well as performance specifications. It may be advantageous to further consider the current assembly of electronic devices, and particularly handheld devices, for enabling efficient transmission and reception of millimeter wave signals.

SUMMARY

An antenna module is described. The antenna module include a ground plane in a multilayer substrate. The antenna module also includes a mold on the multilayer substrate. The antenna module further includes a conductive wall separating a first portion of the mold from a second portion of the mold. The conductive wall is electrically coupled to the ground plane A conformal shield may be placed on a surface of the second portion of the mold. The conformal shield is electrically coupled to the ground plane.

A method of integrating a mold in an antenna module is described. The method includes depositing a mold compound on a multilayer substrate. The multilayer substrate includes a ground plane and a multilayer antenna. The method also includes forming a conductive wall separating a first portion of the mold compound from a second portion of the mold compound. The conductive wall is electrically coupled to the ground plane. The method further includes depositing a conformal shield material on at least a surface of the second portion of the mold compound.

An antenna module is described. The antenna module include a ground plane in a multilayer substrate. The antenna module also includes a multilayer antenna in the multilayer substrate. The antenna module further includes a mold on the multilayer substrate. The antenna module further includes means for suppressing a lossy mold effect of the mold on the multilayer antenna in the multilayer substrate.

This has outlined, rather broadly, the features and technical advantages of the present disclosure in order that the detailed description that follows may be better understood. Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

So that the manner in which the above-recited features of the present disclosure can be understood in detail, a more particular description, briefly summarized below, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

DETAILED DESCRIPTION

Figure 1:
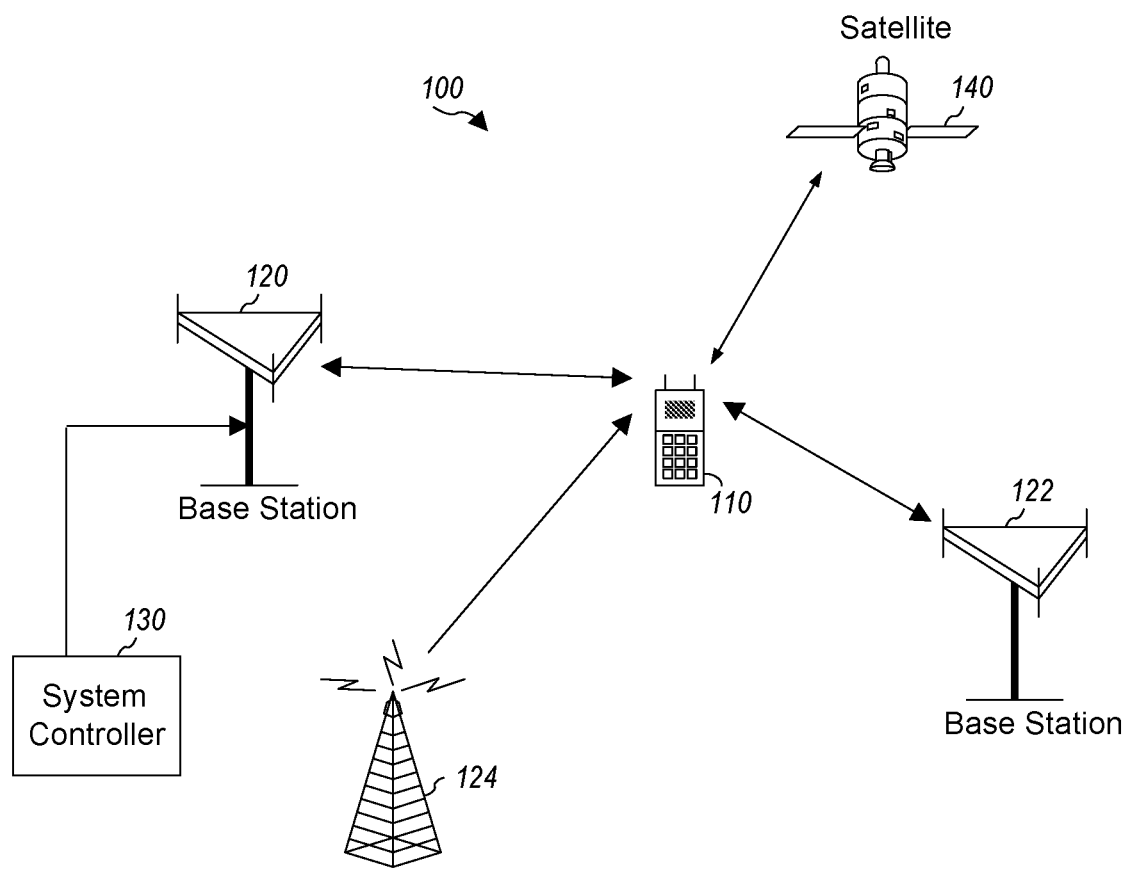
FIG. 1 shows a wireless device communicating with a wireless system, according to an exemplary configuration of the present disclosure.

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. It will be apparent, however, to those skilled in the art that these concepts may be practiced without these specific details. In some instances, well-known structures and components are shown in block diagram form in order to avoid obscuring such concepts.

As described herein, the use of the term "and/or" is intended to represent an "inclusive OR", and the use of the term "or" is intended to represent an "exclusive OR". As described herein, the term "exemplary" used throughout this description means "serving as an example, instance, or illustration," and should not necessarily be construed as preferred or advantageous over other exemplary configurations. As described herein, the term "coupled" used throughout this description means "connected, whether directly or indirectly through intervening connections (e.g., a switch), electrical, mechanical, or otherwise," and is not necessarily limited to physical connections. Additionally, the connections can be such that the objects are permanently connected or releasably connected. The connections can be through switches. As described herein, the term "proximate" used throughout this description means "adjacent, very near, next to, or close to." As described herein, the term "on" used throughout this description means "directly on" in some configurations, and "indirectly on" in other configurations.

Wireless communications devices, which may include one or more transmitters and/or receivers, have one or more antennas capable of transmitting and receiving RF signals over a variety of wireless networks and associated bandwidths. These antennas may be used for fifth generation (5G) millimeter wave (mmW) communications, WLAN communications (e.g., 802.11ad and/or 802.11ay), and/or other communications.

Designs for such millimeter wave (mmW) antennas and integrated circuits (e.g., radio frequency integrated circuits (RFICs), power management integrated circuits (PMICs), etc.) are desired. According to some embodiments, there may be a desire to integrate these antennas and ICs in a chip package. This integration may involve depositing a mold on the RFIC, the PMIC, and other circuitry to implement conformal shielding and reliability in the package. Notably, characteristics of epoxy-based molding compounds may result in significant loss in high frequency applications, such as 5G mmW applications, which is referred to herein as a lossy mold effect.

Solutions for reducing loss in high frequency applications include reducing the amount of mold or avoiding depositing a mold directly on an antenna element(s). These solutions, however, may reduce the shielding and reliability in the package.

Aspects of the present disclosure are directed to improvements in antenna systems, for example mmW antenna systems, fifth generation (5G) antenna systems ("5G Antenna Systems"), and/or WLAN antenna systems. Certain aspects described herein relate to a design and method of integrating a mold with a multilayer millimeter wave (mmW) antenna, a radio frequency (RF) integrated circuit (RFIC), and other circuits.

In one aspect of the present disclosure, a conductive wall separates two portions of a mold. As described herein, a first portion of the mold is referred to herein as a non-metalized mold, and a second portion of the mold is referred to herein as a metallized mold due to coverage of the metalized mold with a shield material. It should be recognized that although referred to as metallized or non-metallized, the mold is otherwise formed of the same material (e.g., epoxy, polyimide or other like mold material). The mold may be deposited on a multilayer substrate, including a multilayer antenna. In this configuration, the conductive wall separates the non-metallized mold (non-shielded mold) that does not include a conformal shield from the metallized mold (shielded mold) that encapsulates integrated circuits. The conductive wall may be formed by filling a conductive paste or by sputtering conductive particles. Alternatively, the conductive wall may be composed of a conductive solid sheet or a frame. Forming the conductive wall suppresses a lossy mold effect on antennas caused by conventional epoxy molding. Therefore, system performance of the antenna module is not degraded significantly.

In various configurations, the conductive wall may be connected to a ground plane in the multilayer substrate. The conductive wall may act as a reflector by preventing the metallized mold from detrimentally affecting the antenna element, in which the wall is offset from the antenna element by approximately a ¼ wavelength. The conductive wall can be formed on the other sides of the mold as desired (e.g., right, left, back, and/or top). In addition, the conductive wall can be configured as a series of connected vias to enable electrical connection of the conductive wall to the ground plane in the multilayer substrate.

FIG. 1 illustrates a wireless device 110 communicating with a wireless communications system 100, having an antenna module integrated with a mold. Wireless communications system 100 may be a fifth generation (5G) millimeter wave (mmW) system, a long term evolution (LTE) system, a code division multiple access (CDMA) system, a global system for mobile communications (GSM) system, a wireless local area network (WLAN) system, or some other wireless system. A CDMA system may implement wideband CDMA (WCDMA), CDMA 1X, evolution-data optimized (EVDO), time division synchronous CDMA (TD-SCDMA), or some other version of CDMA. For simplicity, FIG. 1 shows wireless communications system 100 including two base stations 120 and 122 and one system controller 130. In general, a wireless system may include any number of base stations and any set of network entities. In some embodiments, one or more of the base stations are implemented as access points, for example as might be implemented in a WiFi system. The wireless device 110 may communicate at separate times with two or more of the systems listed above, or may concurrently communicate with several systems.

The wireless device 110 may also be referred to as user equipment (UE), a mobile station, a mobile device, a terminal, an access terminal, a subscriber unit, a station, etc. Wireless device 110 may be a cellular phone, a smartphone, a tablet, a wireless modem, a personal digital assistant (PDA), a handheld device, a laptop computer, a smartbook, a netbook, a cordless phone, a wireless local loop (WLL) station, a Bluetooth device, a medical device, an apparatus communicating with the Internet of Things (IoT), etc. Wireless device 110 may communicate with wireless communications system 100. Wireless device 110 may also receive signals from broadcast stations (e.g., broadcast station 124), signals from satellites (e.g., satellite 140) in one or more global navigation satellite systems (GNSS), etc. Wireless device 110 may support one or more radio technologies for wireless communications including LTE, WCDMA, CDMA 1X, EVDO, TD-SCDMA, GSM, 802.11, 5G (e.g., millimeter wave (mmW) systems), etc.

Figure 2:
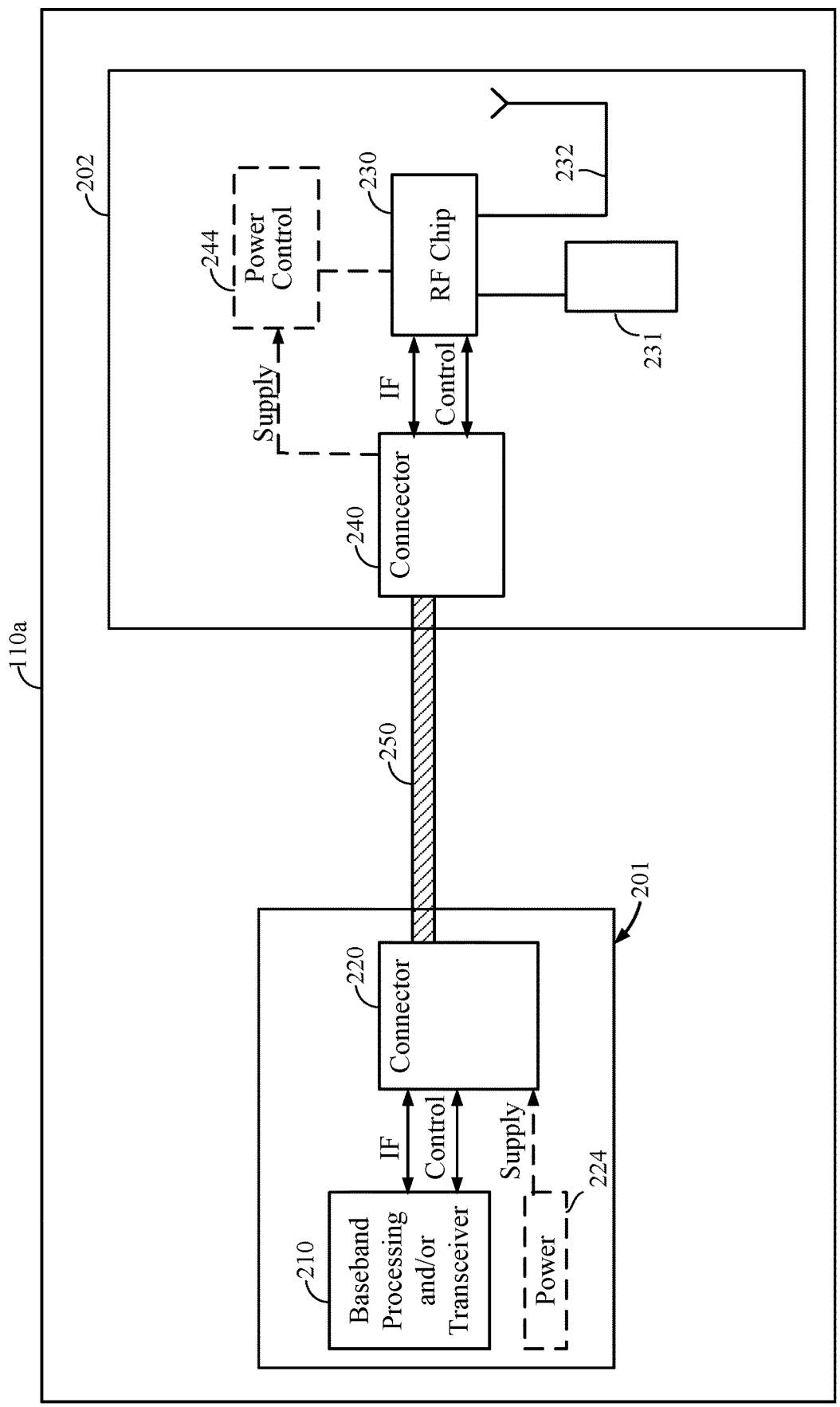
FIG. 2 illustrates a block diagram of the wireless device shown in FIG. 1.

FIG. 2 illustrates an example 110*a* of the wireless device 110 described in FIG. 1. The wireless device 110*a* includes baseband processing and/or transceiver elements 210 coupled to a connector 220. The transceiver elements 210 may include a baseband chip configured to process data and provide digital signals to a transceiver chip configured to convert those digital signals into analog intermediate frequency (IF) signals. The baseband chip and/or the transceiver chip of the transceiver elements 210 may provide both the IF signals to the connector 220 for transmission and control signals to the connector 220. Further, the transceiver elements 210 may receive IF signals through the connector 220 and may additionally downconvert these signals and provide corresponding digital signals to the baseband chip for processing. The transceiver elements 210 may also provide a local oscillator (LO) signal (not illustrated) to the connector 220. The LO signal may be separate from or combined with the IF signal, for example, as described in greater detail below.

In the configuration illustrated in FIG. 2, the wireless device 110*a* further includes a power source 224 coupled to the connector 220. The power source 224 may by any element configured to provide power or a supply voltage (e.g., Vdd). For example, the power source 224 may be a battery, an input coupled to a power input such as a USB input or a wireless charging input, a power management integrated circuit (PMIC), or a combination of these elements or other elements.

The transceiver elements 210 including the baseband chip and/or the transceiver chip, the connector 220, and/or the power source 224 may be arranged on a board 201 (e.g., a circuit board and/or phone board). For example, chips, dies, and/or modules implementing these elements may be coupled together with traces on a printed circuit board (PCB).

The wireless device 110*a* may further include RF processing elements (e.g., an RF chip 230) coupled to a connector 240. The RF circuitry may perform up-conversion of signals based on the IF signals and the control signals from the connector 240 and down-conversion of received signals. The RF processing elements of the RF chip 230 may be coupled to antennas 231 and 232 for transmission and reception of wireless signals. While two antennas are illustrated in FIG. 2, those of skill in the art will understand that additional or fewer antennas may be implemented. In an aspect of the present disclosure, one or more of the implemented antennas includes a phase array antenna. The wireless device 110*a* may enable efficient transmission and reception of signals having a millimeter wavelength, for example in at least in the 24-40 GHz range. (e.g., 28 GHz, 39 GHz, etc.), 60 GHz range, or higher.

In the configuration illustrated in FIG. 2 the wireless device 110*a* further includes a power control integrated circuit (IC) 244 (e.g., a power management IC (PMIC)). The power control IC 244 receives the supply voltage from the connector 240 and is configured to convert the supply voltage into several different voltages for use by components of the RF processing elements of the RF chip 230.

The RF processing elements of the RF chip 230, the connector 240, the power control IC 244, and/or the antennas 231, 232 may be arranged on a circuit board or substrate or integrated in a module 202. For example, chips and/or dies implementing these elements may be implemented in a module or chip as described below.

The transceiver elements 210 and the RF processing elements of the RF chip 230 may be spaced apart from each other and connected using a communications cable 250 (or multiple transmission lines), for example, through the connector 220 and the connector 240. In one aspect of the present disclosure, the transceiver elements 210 and the RF processing elements of the RF chip 230 are respectively located near a central portion of the wireless device 110*a* and near the periphery of the wireless device 110*a*. Placement of the transceiver elements 210 and the RF processing elements of the RF chip 230 apart from each other may allow efficient processing of information while achieving increased performance for reception/transmission of wireless signals. Such placement may not be in near proximity.

One or more signals may be transferred over the communications cable 250 including, but not limited to, power, control, IF, and LO signals. The IF and control signals may be transferred over the communications cable 250 in both directions, such that the communications cable 250 is bi-directional. The control signals may control switching of the antennas (e.g., between TX and RX), direction of the antenna (e.g., beam forming), and gain. LO signals may be used to synchronize components in the transceiver elements 210 and the RF processing elements of the RF chip 230, and/or to perform up and down-conversions of high frequency signals.

In some configurations, each of the signals is transferred over a separate line of the communications cable 250. For example, a coaxial cable may carry each signal between the board 201 and the module 202. In other configurations, the communications cable 250 includes multiple lines to transfer the signals. For example, the communications cable 250 may be a flex cable or flexible circuit board including multiple lines. In yet another configuration, two or more of the signals may be combined onto a single line or cable. For example, each signal transferred over the communications cable 250 may have a different frequency band.

In certain aspects of the present disclosure, a frequency plan enables the efficient transfer of two or more (or all) signals over the communications cable 250. In accordance with certain aspects of the present disclosure, the communications cable 250 is a standard micro coaxial cable. In this configuration, the connection between the board 201, the module 202, and the micro coaxial cable is provided using a micro connector. According to another aspect, the communications cable 250 can be formed by fabricating a metal line on a multilayer substructure.

When multiple signals are simultaneously conveyed over the communications cable 250, the signals may be multiplexed onto the communications cable 250 or one of the signals may be modulated onto the other. The transceiver elements 210 may include circuity configured for such multiplexing or modulation. In particular, the transceiver elements of the RF chip 230 may include circuitry for corresponding de-multiplexing or demodulation. An example of such conveyance is described below with respect to FIG. 3.

In some configurations, the power control IC 244 is omitted from the module 202. In such configurations, separate voltages may be received from a component on the board 201 (e.g., from a PMIC), either through the communications cable 250 or through another conveyance. For example, a PMIC may be implemented on the board 201 at a location closer to the module 202 than to the transceiver elements 210. In this configuration, providing separate specified voltage levels to the module 202 instead of implementing the power control IC 244 on the module 202 may reduce the length of routing lines and/or obviate the use of certain components on the module 202, such as inductors used to implement the power control IC 244. In some configurations, the transmission of separate voltages to the module 202 results in reduced efficiency due to routing the multiple voltages, but also results in reduced size, cost, and complexity of the module 202.

Figure 3:
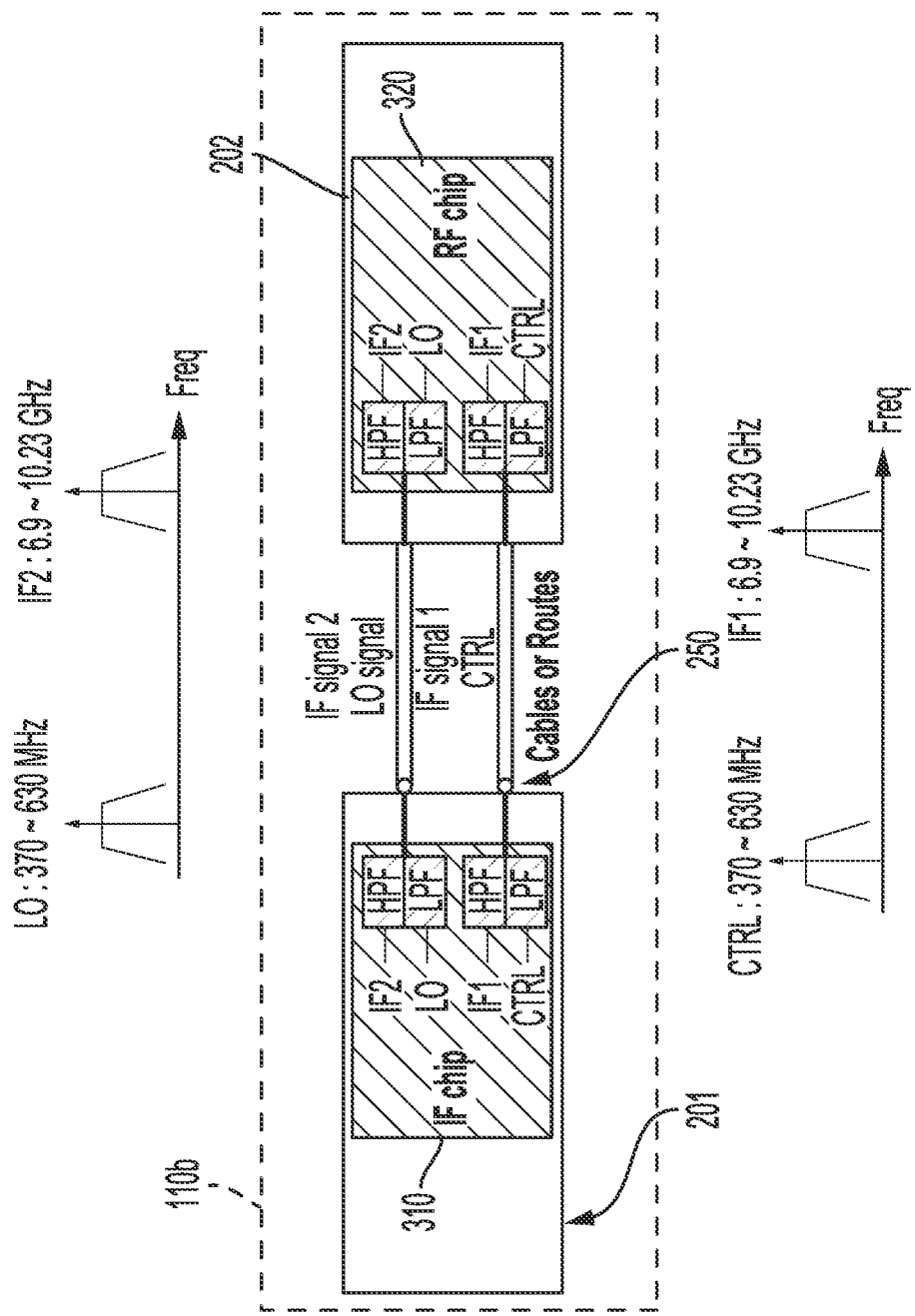
FIG. 3 illustrates an example of the wireless device described in FIG. 1, and includes a description of one configuration for combining information on a line, according to aspects of the present disclosure.

FIG. 3 illustrates an example 110b of the wireless device 110 described in FIG. 1, and includes a description of one configuration for combining information on a line, according to aspects of the present disclosure. The wireless device 110b includes the board 201 coupled to the module 202 by a communications cable 250, as illustrated in FIG. 2. In the configuration illustrated in FIG. 3, an IF chip 310 is disposed on the board 201 and is configured to provide two IF signals, an LO signal and a control signal, to the module 202 via the communications cable 250.

As described above with respect to FIG. 2, one or more of these signals may be transmitted in both directions (e.g., not only from the board 201 to the module 202, but also from the module 202 to the board 201). While not illustrated in FIG. 3, elements described as being on the board 201 in FIG. 2 may also be implemented in the wireless device 110b. For example, the connector 220 may be implemented between the IF chip 310 and the communications cable 250, or may be omitted as illustrated in FIG. 3.

According to aspects of the present disclosure, omission of the connector 220 may be beneficial in some configurations where the communications cable 250 is routed to another section of the board 201 instead of to a separate board, for example as described in greater detail below. Further, the IF chip 310 may be implemented within the transceiver elements 210 illustrated in FIG. 2, or may be separately implemented. Similarly, the power source 224 may be implemented or omitted, and may transmit the supply voltage over the communications cable 250 in some configurations of the wireless device 110b.

In the configuration illustrated in FIG. 3, an RF chip 320 is disposed on the module 202 and is configured to receive the two IF signals, the LO signal and the control signal, via lines of the communications cable 250. The RF chip 320 may be configured to upconvert the IF signals to RF signals using the LO signal and/or the control signal and wirelessly transmit RF signals, for example, based on the control signals. Transmission may be via one or more antennas (not illustrated in FIG. 3), such as the antennas 231 and 232 illustrated in FIG. 2.

The RF chip 320 may further be configured to wirelessly receive RF signals, downconvert them to IF signals, and transmit them via the lines of the communications cable 250 to the IF chip 310. While not illustrated in FIG. 3, elements described as being disposed on the board 201 or the module 202 in FIG. 2 may also be implemented in the wireless device 110b. For example, the connector 240 may be implemented between the RF chip 320 and the lines of the communications cable 250, or may be omitted as illustrated in FIG. 3. Similarly, the power control IC 244 may be included in some configurations. The RF chip 320 may be implemented within the RF processing elements of the RF chip 230 illustrated in FIG. 2, or may be separately implemented.

In the configuration illustrated in FIG. 3, one IF signal is transmitted over each of the lines of the communications cable 250 and another signal is combined with the respective IF signal on the respective line of the communications cable 250. For example, a first IF signal (IF1) may be combined with a control signal (CTRL) for communications over a line of the communications cable 250. Similarly, a second IF signal (IF2) may be combined with the LO signal for communications over another line of the communications cable 250.

In this example, the IF signals (e.g., IF1 and IF2) may have a frequency in the range of approximately 6.9-10.23 GHz. An LO signal having a frequency in the range of approximately 370-630 MHz may therefore be combined with one of the second IF signals IF2. Similarly, a CTRL signal also having a frequency in the range of approximately 370-630 MHz may be combined with the first IF signal IF1. In this way, the number of communications lines of the communications cable 250 specified to transmit all of the signals may be reduced. Certain frequencies are provided above as an example, but embodiments are not limited to these frequencies. One or more of the CTRL signal, LO signal, IF1 signal, and IF2 signal may have a frequency different than described above. For example, the IF1 signal and/or the IF2 signal may have a frequency of approximately 11 GHz or higher. In some embodiments, the IF1 signal and the IF2 signal have different frequencies.

Prior to being transmitted over the cable 250, the IF1 and IF2 signals and the LO signal and/or the CTRL signal may be passed through a high pass filter (HPF), a low pass filter (LPF), and/or a bandpass filter (BPF) to reduce any potential interference with another signal that will be transmitted on the same communications line. At the receiving end, the combined signal may be passed through an HPF, an LPF, and/or a BPF to isolate and/or separate the different components of the combined signal.

Figure 4:
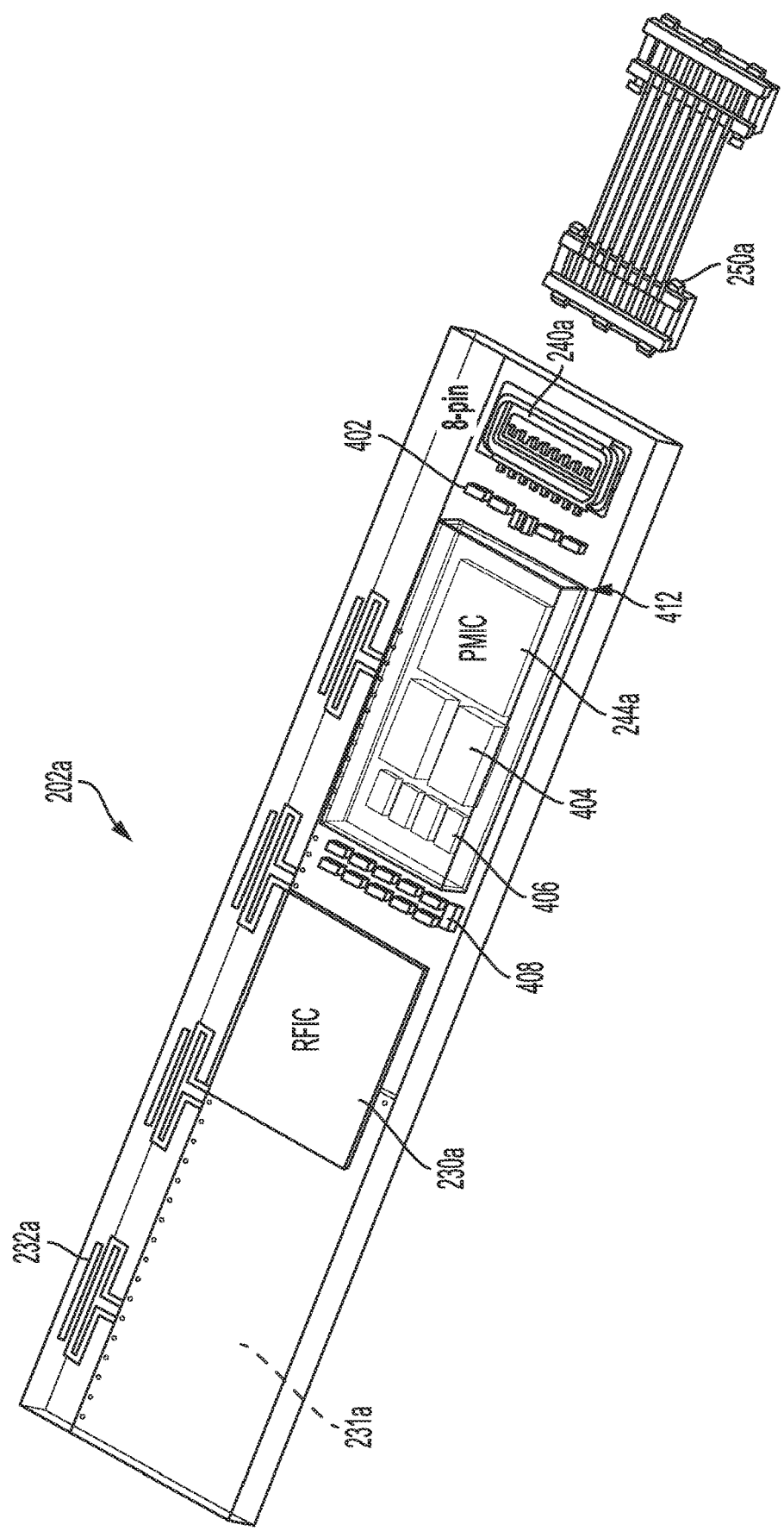
FIG. 4 illustrates an example of a module of the wireless device described in FIGS. 2 and 3, according to aspects of the present disclosure.

FIG. 4 illustrates an example 202a of the module 202 of the wireless device 110 described in FIGS. 2 and 3, according to aspects of the present disclosure. In the illustrated configuration, the module 202a includes a connector 240a, which is illustrated as an eight-pin connector. The connector 240a may be configured to couple to a flex cable 250a. In one such configuration, there may be several lines for intermediate frequency (IF) signals (e.g., two or more), a line for a power supply (e.g., $V_{batt}$ or $V_{DD}$), a local oscillator (LO) signal, and a control (CTRL) signal, with the remaining lines being dedicated to ground.

In some configurations, IF signals, an LO signal and/or a control (CTRL) signal are modulated onto the same line, as described above with respect to FIG. 3. For example, one configuration of the module 202a may include a first intermediate frequency (IF1) signal and a control signal (CTRL) on one line, a second IF (IF2) signal and an LO signal on another line. The configuration also includes a ground line associated with each of the IF1 and IF2 lines, a $V_{batt}$ line, a line for a voltage of approximately 1.85 V, and two additional ground lines. Those of skill in the art will understand that a flex cable 250a having fewer lines and a connector 240a having less pins may be implemented. In some configurations where fewer lines are used, a signal line may be used as a ground or there may be a row of vias in a flexible connector used for the flex cable 250a.

The illustrated configuration of the module 202a further includes a set of filtering capacitors 402 coupled to a power control IC 244a (e.g., a power management IC (PMIC)). The power control IC 244a is further coupled to regulator elements 404 that may be used to control buck and/or boost voltage regulation. For example, capacitors 406 may be coupled to the regulator elements 404 and be included as buck capacitors for storing and releasing energy. The power control IC 244a, the RFIC 230a, the regulator elements 404, and the capacitors 406 may be enclosed within a shield 412 or molding, as described further below. The capacitors 406 may be further coupled to several bypass capacitors 408, which may be coupled to RF processing elements of an RF integrated circuit (RFIC) (e.g., RFIC 230a), for example, as described with respect to the RF chip 320 shown in FIG. 3. The RF processing elements of the RFIC 230a may be further coupled to certain pins of the connector 240a, for example, to IF pins, LO pins, and control pins.

The RFIC 230a may be further coupled to one or more antennas (e.g., antennas 231a and/or 232a). In the illustrated configuration, the antennas 232a (e.g., dipole or bowtie) are illustrated. In one configuration, each of the antennas 232a is aligned with a respective antenna 231a, which is implemented in a lower layer and is not visible in FIG. 4. For example, one of the antenna 231a may comprise a 4×1 array of patch antennas configured for transmission and reception using millimeter wave signals. In other configurations, a greater or fewer number of antennas may be used.

In one configuration, the module 202a is approximately 21 mm (millimeters) long, 6.6-6.65 mm wide, and 1.78-1.8 mm thick. Other sizes or shapes may also be implemented.

One of skill in the art will appreciate that the coupling elements described above with respect to the module 202a may be implemented in a layer underneath what is illustrated in FIG. 4 and may not be visible in the figure. For example, there may be five conductive (e.g., metal) routing layers that are not visible. In addition to these routing layers, a ground layer, which may be separate from metal layers implementing the antenna 231a (e.g., patch antenna), is obscured by a dielectric core. In some configurations, each of the patch antennas is approximately 2.4 mm square and may consist of three or four conductive (e.g., metal) layers in combination with two or three additional layers for routing and/or ground. In this way, there may be a symmetrical number of layers on each side of the dielectric.

One of skill in the art will appreciate that while a certain number of capacitors or other elements are illustrated in FIG. 4, different numbers of such capacitors or elements may be implemented. Further, other shapes, sizes, components, and configurations may be utilized. For example, other potential configurations are illustrated in FIGS. 5 and 6.

Figure 5:
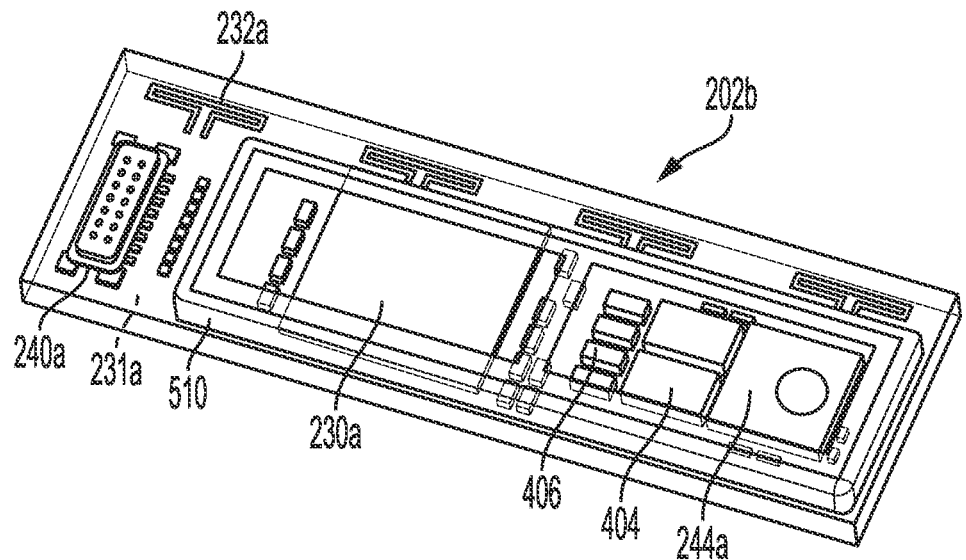
FIG. 5 illustrates an example of a module of the wireless device described in FIGS. 2 and 3, according to aspects of the present disclosure.
Figure 6:
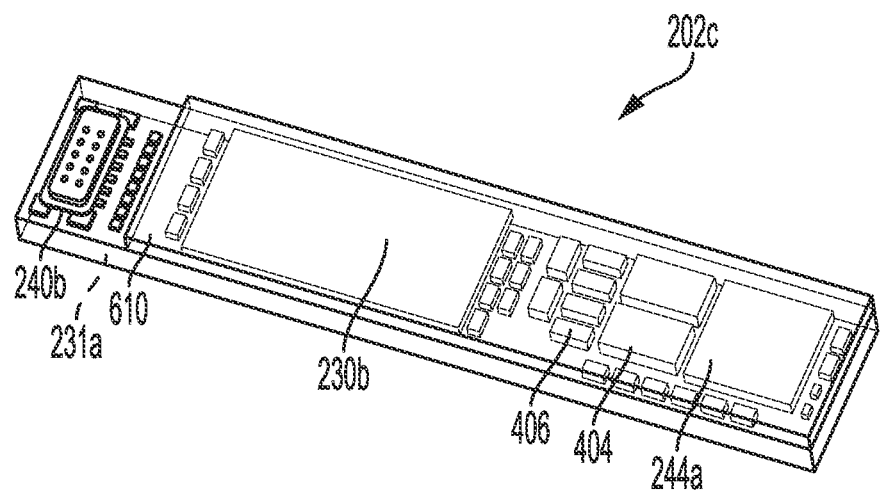
FIG. 6 illustrates an example of a module of the wireless device described in FIGS. 2 and 3, according to aspects of the present disclosure.

FIG. 5 illustrates an example 202b of the module 202 of the wireless device 110 described in FIGS. 2 and 3, according to aspects of the present disclosure. As can be seen in FIG. 5, the module 202b includes the connector 240a, the antennas 232a, the RFIC 230a, the regulator elements 404, the capacitors 406, the power control IC 244a, and optionally the antenna 231a. The module 202b may further include other elements, which are illustrated in FIG. 5 and similar to those described in FIG. 4, but not specifically identified.

One difference between the module 202a of FIG. 4 and the module 202b of FIG. 5 is that the implemented elements are arranged in a different configuration. For example, in the example illustrated in FIG. 5, the RFIC 230a is disposed nearer to the connector 240a than in FIG. 4. In some configurations, this may simplify or reduce the routing between the connector 240a and the RFIC 230a. In some configurations, the RFIC 230a is approximately 5 mm long and 4.6 mm wide.

Another difference between the module 202a of FIG. 4 and the module 202b of FIG. 5 is that a shield 510 extends over both the RFIC 230a and the power control IC 244a. The shield 510 may be configured, for example, as a metal shield "can." In some configurations, the power control IC 244a may be separated from the RFIC 230a by a (e.g., metal) wall or barrier inside the shield 510. In some configurations, a separate shielding is formed around the power control IC 244a inside the shield 510. The module 202b may be sized similar to the module 202a in some configurations. In other configurations, the shield 510 results in an increased thickness, for example, of around 2.15 mm.

FIG. 6 illustrates an example 202c of the module 202 of the wireless device 110 described in FIGS. 2 and 3, according to aspects of the present disclosure. As can be seen in FIG. 6, the module 202c includes the regulator elements 404, the capacitors 406, the power control IC 244a, and the antenna 231a. The module 202c may further include other elements that are illustrated in FIG. 6 and similar to those described in FIG. 4, but not specifically identified here.

The module 202c is illustrated in FIG. 6 as including a six-pin connector as the pin connector 240b. In some configurations, one or more of the ground lines may be omitted as compared to the configurations of the flex cable 250a described above with respect to FIG. 4. In some configurations, one of the voltages (e.g., 1.85 V) carried by the flex cable 250a is omitted. In this aspect of the present disclosure, the module 202c is illustrated as omitting the antennas 232a. In some configurations, omission of the antennas 232a and/or use of the pin connector 240b with fewer pins may result in a reduced width of the module 202c relative to the module 202b of FIG. 5.

In the configuration illustrated in FIG. 6, the RF processing elements of a RFIC 230b are configured in a different shape as compared to the RFIC 230a shown in FIG. 5. For example, the RFIC 230b may be approximately 7 mm long and 3.5 mm wide. This may be a contributing factor in reducing a size of the module 202c.

The module 202c may further include a shield 610 covering both the IC or the RFIC 230b and the power control IC 244a. In some configurations, the module 202c is implemented using a conformal molding with a sputtered shield. These aspects, as well as the aspects described above, may result in a reduced size of the module 202c. For example, in one configuration the module 202c is approximately 20 mm long, 4 mm wide, and 1.8 mm thick.

Aspects of the present disclosure integrate an antenna module (e.g., 202) incorporating an RFIC (e.g., 230), a PMIC (e.g., 244), and an antenna array (e.g., 232) for supporting 5G communications millimeter wave (mmW) and/or WLAN applications. As will be described below, this integration may involve depositing a mold on the RFIC, the PMIC, and other circuitry to implement conformal shielding and reliability in the package, as shown in FIG. 6. Unfortunately, characteristics of molding compounds may result in significant loss in high frequency applications, such as 5G mmW and/or WLAN applications.

Solutions for reducing loss in high frequency applications may include reducing the amount of mold or avoiding depositing a mold directly on an antenna element(s). These solutions, however, may reduce the shielding and reliability in the package. Aspects of the present disclosure relate to a design and method of integrating a mold with a multilayer millimeter wave (mmW) antenna, a radio frequency (RF) integrated circuit (RFIC), and, optionally, a power management IC (PMIC), for example, as shown in FIG. 7.

Figure 7:
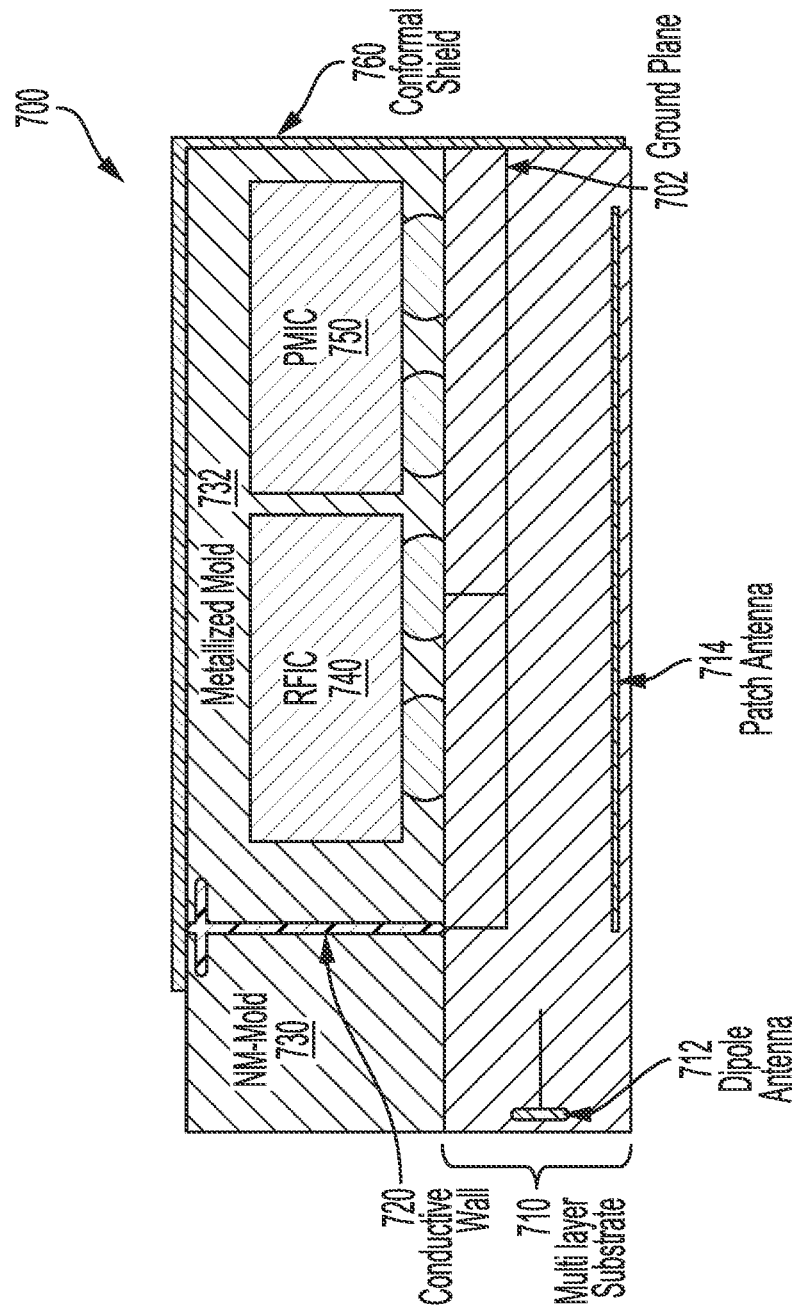
FIG. 7 illustrates an antenna module having a radio frequency (RF) processing integrated circuit (IC) and a power control IC embedded in a mold on the antenna module, having a multilayer antenna exposed by the mold, according to aspects of the present disclosure.

FIG. 7 illustrates an antenna module 700 having an RF processing IC and a power control IC embedded in a mold on the antenna module 700, and having a multilayer antenna exposed by the mold, according to aspects of the present disclosure. The antenna module 700 may be a configuration of the module 202. As shown in FIG. 7, the RF processing IC may be an RFIC 740, such as the RFIC 230b, as shown in FIG. 6. In addition, the power control IC may be a PMIC 750, such as the power control IC 244, as shown in FIGS. 4 to 6. In an alternative configuration, the RF processing IC may be the RF chip 320 shown in FIG. 3, and the power control IC may be the IF chip 310 shown in FIG. 3. The RFIC 740 and the PMIC 750 are embedded in a metallized mold 732 that is separated from a non-metallized mold 730 (e.g., NM-Mold) by a conductive wall 720. The conductive wall 720 can include eaves that overhang either the dipole antenna 712 or the metallized mold 732 and may have a height of approximately 0.79 millimeters (mm).

In this configuration, the conductive wall 720 is connected to a ground plane 702 in the multilayer substrate 710, as well as to a conformal shield 760. The conductive wall 720 may act as a reflector by preventing the metallized mold 732 from detrimentally affecting an antenna element (e.g., dipole antenna 712), in which the conductive wall 720 is offset from the antenna element by approximately a ¼ wavelength. The conductive wall 720 can be formed on the other sides of the metallized mold 732 as desired (e.g., right, left, back, and/or top). In addition, the conductive wall 720 can be configured as a series of connected vias to enable electrical connection of the conductive wall 720 to the ground plane 702 in the multilayer substrate 710. In this configuration, the ground plane 702 is also connected to the conformal shield 760, as further described below.

FIG. 7 shows the conformal shield 760 covering the metallized mold 732 as well as the conductive wall 720 to protect the RFIC 740 and the PMIC 750. The conformal shield 760 may be composed of a conductive material, such as a sputtered conductive material (e.g., copper) on the portion of the surface of the metallized mold 732, a sidewall of the metallized mold 732, and a sidewall of the multilayer substrate 710. In this arrangement, the conformal shield is also electrically coupled to the ground plane The non-metallized mold 730, however, does not include the conformal shield 760 to prevent shielding of, for example, the dipole antenna 712. The multilayer substrate 710 may include a multilayer antenna composed of a patch antenna 714 communicably coupled to the dipole antenna 712. In this configuration, the ground plane 702 in the multilayer substrate 710 stops at the conductive wall 720 and is arranged to reduce blocking of a radiation pattern of the dipole antenna 712. Although a single dipole antenna (e.g., 712) and patch antenna (e.g., 714) are shown, one of skill in the art will appreciate that an array of multilayer antenna, including the dipole antenna 712 and the patch antenna 714 may be implemented.

FIG. 7 shows the conductive wall 720 formed on one side of the non-metallized mold 730 that is deposited on the multilayer substrate 710. In this configuration, the conductive wall 720 separates the non-metallized mold 730 (non-shielded mold) that does not include the conformal shield 760 from the metallized mold 732 (shielded mold) that encapsulates the integrated circuits (e.g., the RFIC 740 and the PMIC 750). The conductive wall 720 may be formed by filling a conductive (e.g., copper (Cu)) paste or by sputtering conductive (e.g., Cu) particles. Alternatively, the conductive wall 720 may be composed of a conductive solid sheet or a conductive frame, such as the shield 510 shown in FIG. 5. Forming the conductive wall 720 suppresses a lossy mold effect of the metallized mold 732 on, for example, the dipole antenna 712, caused by conventional epoxy molding. Therefore, system performance of the antenna module 700 is not degraded significantly.

Figure 8A:
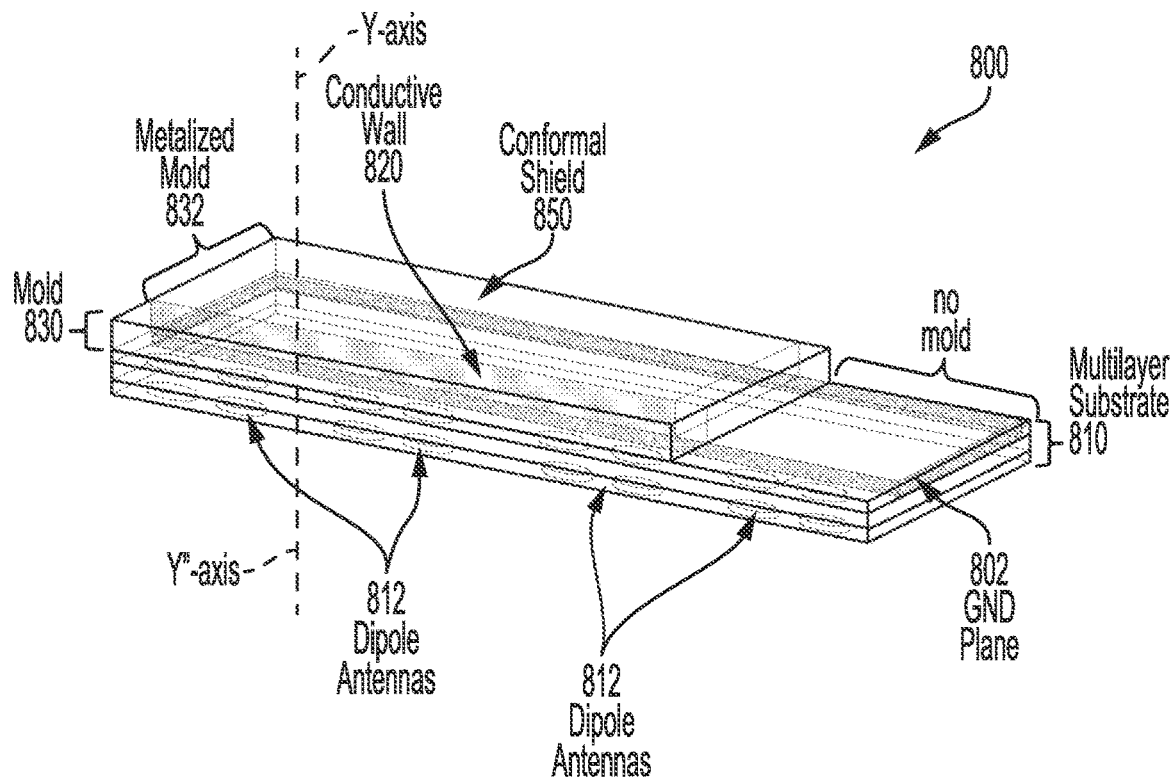
FIGS. 8A and 8B illustrate a perspective view and a cross-section view of an antenna module, having chips embedded in a mold on the antenna module and a multilayer antenna having a portion exposed by the mold, according to aspects of the present disclosure
Figure 8B:
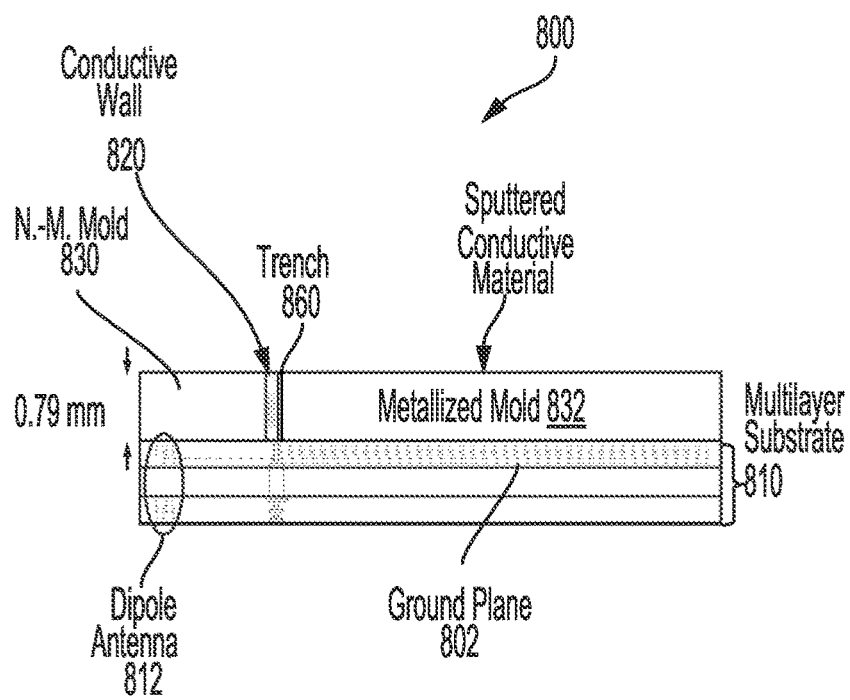

FIGS. 8A and 8B illustrate a perspective view and a cross-section view of an antenna module 800, having chips embedded in a mold on the antenna module 800 and a multilayer antenna having a portion exposed by the mold, according to aspects of the present disclosure. The antenna module 800 may be a configuration of the module 202, and may include a connector (not illustrated in FIGS. 8A and 8B) configured to couple to a cable 250.

FIG. 8A illustrates the perspective view of the antenna module 800, in which chips embedded in a metallized mold 832 are obscured by a conformal shield 850, according to aspects of the present disclosure. In this arrangement, the antenna module 800 is configured similarly to the antenna module 700 shown in FIG. 7. The antenna module 800 is shown to include an array of dipole antennas 812 printed in layers of a multilayer substrate 810 backed by a ground plane 802, as further illustrated in FIG. 8B. The conformal shield 850 on the metallized mold 832 is separated from a non-metallized mold 830 by a conductive wall 820 as well as a trench (non-identified in FIG. 8A). In this example, the trench may be formed by etching between the metallized mold 832 and the conductive wall 820. Certain of the dipole antennas 812 and/or patch antennas may be uncovered by a non-metallized mold 830 and/or the metalized mold 832. For example, in the illustrated embodiment the multilayer substrate 810 also includes a portion with no-mold. In one configuration, a trench is formed between the conductive wall 820 and the metallized mold 832, as further illustrated in FIG. 8B.

FIG. 8B is a cross-section view of the antenna module 800 along a Y-Y" axis shown in FIG. 8A, according to aspects of the present disclosure. Representatively, one of the dipole antennas 812 is shown in the multilayer substrate 810, and backed by the ground plane 802 and the conductive wall. In this configuration, the portion of the multilayer substrate 810 including the dipole antennas 812 is covered by the non-metallized mold 830 and does not include the ground plane 802 to prevent degradation of a radiation pattern of the dipole antennas 812. A trench 860 is also formed between the conductive wall 820 and the metallized mold 832, which may further aid in suppressing effects of the lossy mold on the antenna module 800.

According to aspects of the present disclosure, the conductive wall 820 as well as the trench 860 are on one side of the metallized mold 832 to suppress effects of a lossy mold for causing significant performance degradation (e.g., 1.9 dB gain realized at 38.5 GHz) of the antenna module 800. In one configuration, the conductive wall 820 is connected to the ground plane 802. This arrangement enables the conductive wall 820 to act as a reflector by keeping the mold (e.g., the non-metallized mold 830 and the metallized mold 832) from affecting the dipole antennas 812. For example, the conductive wall 820 may be offset from the dipole antenna by approximately a ¼ wavelength to reflect a radiation pattern of the dipole antennas. Although shown on one side of the metallized mold 832, the conductive wall 820 and the trench 860 may be arranged on other sides of the metallized mold 832 (e.g., right side, left side, backside, and/or top side) to enable placement of additional ones of the dipole antennas on the periphery of the antenna module 800. The conductive wall 820 may be formed by filling a conductive (e.g., copper (Cu)) paste or by sputtering conductive (e.g., Cu) particles. In addition, the conductive wall 820 may be fabricated using a series of connected vias through the metallized mold.

Figure 9:
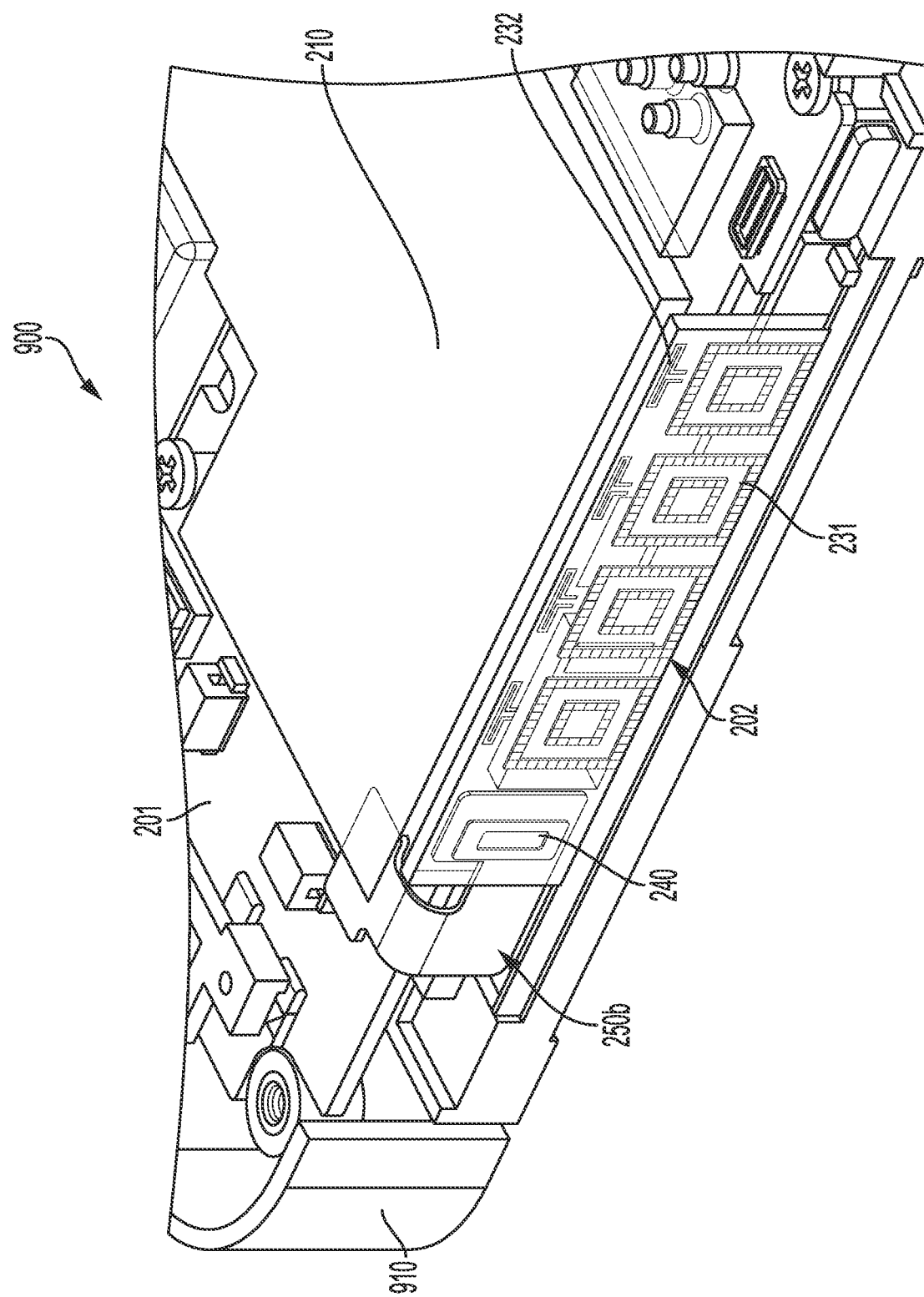
FIG. 9 illustrates a portion of the wireless device described in FIG. 1, incorporating a module, according to aspects of the present disclosure.

FIG. 9 illustrates an example 900 of a portion of the wireless device 110 described in FIG. 1, incorporating a module, according to aspects of the present disclosure. A section of a casing 910 of the device 900 is visible in FIG. 9. This section may stop as illustrated, for example, when a different piece (not illustrated) of the case (e.g., of a different material) is coupled thereto. In other examples, the casing 910 can be interpreted in FIG. 9 as being cutaway for ease of viewing, but may extend all the way across the module 202 when assembled.

In FIG. 9, the baseband and/or the transceiver elements 210 are visible as being mounted on the board 201. The transceiver elements 210 and board 201 may be roughly parallel with a display (not illustrated) of the device 900 and/or a backing (not illustrated) of the device 900.

As can be seen in FIG. 9, the transceiver elements 210 and/or the board 201 may be coupled to the module 202 by the communications cable 250. In the embodiment illustrated in FIG. 9, the communications cable is implemented as a flex cable 250b. For example, the flex cable 250b may include six or eight lines as described above. It can be seen that the module 202 is mounted so as to be at an angle with respect to the board 201. For example, the module 202 may be mounted so as to be roughly perpendicular to the board 201 and/or a chip implementing the transceiver elements 210. In some aspects of the present disclosure, this configuration may save space in the device 900 by using space which is often unused in wireless devices. In other configurations, the module 202 is disposed at an angle other than 90° with respect to the board 201, for example in the range of 60°-80°.

The module 202 may be coupled to the flex cable 250b by the connector 240. Further, in FIG. 9, the antennas 231 (e.g., patch antennas) and the antennas 232 are further illustrated. It will be understood by those of skill in the art that other elements of the module 202 are implemented in FIG. 9, but are not shown for ease of explanation. Rather, the antennas 231 and 232 are illustrated so as to describe certain aspects of the example configuration.

In the configuration illustrated in FIG. 9, the antennas 232 are positioned so as to radiate out through and/or receive through a side including the display and/or backing of the device 900. In some configurations, this provides diversity and/or increases the likelihood of successful transmission and/or reception when one or more of the antennas 231 are blocked. Thus, the antennas 231 and the antennas 232 may radiate and/or receive over an azimuth greater than 180°.

Figure 10:
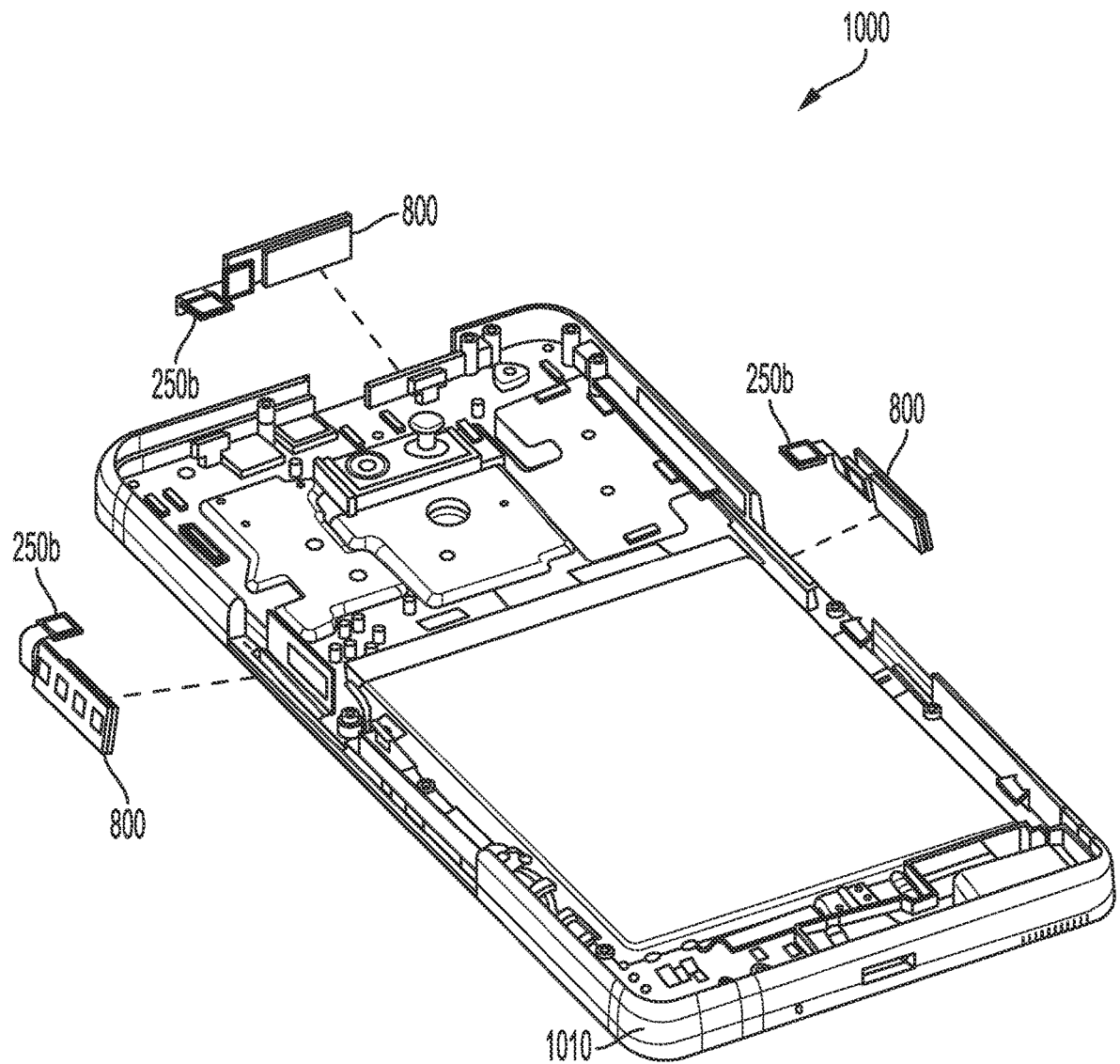
FIG. 10 illustrates an example of the wireless device described in FIG. 1, incorporating multiple antenna modules along a periphery of the wireless device, according to aspects of the present disclosure.

FIG. 10 illustrates an example wireless device 1000 of the wireless device 110 described in FIG. 1, incorporating multiple antenna modules along a periphery of the wireless device 1000, according to aspects of the present disclosure. A housing 1010 as well as internal portions of the wireless device 1000 are visible in FIG. 10. In this example, each antenna module 800 uses the flex cable 250b to secure the antenna module 800 to a point along a periphery of the housing 1010 of the wireless device 1000. This configuration fits each antenna module 800 inside the housing with minimal impact on existing circuit board space, antennas, speakers, cameras, and the like. This configuration may be beneficial for fifth generation (5G) and/or WLAN millimeter ware (mmW) communications, which are more directional than lower frequencies (e.g., 4G bands <3 GHz).

Figure 11A:
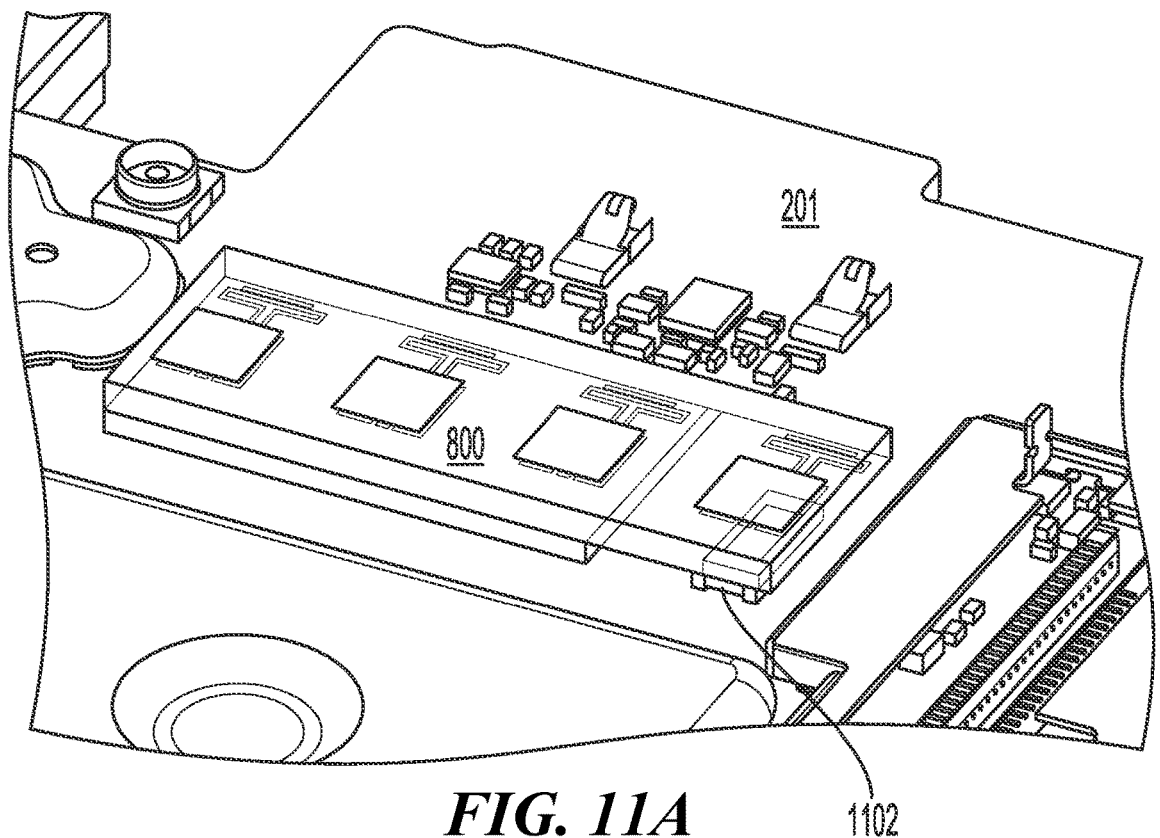
FIGS. 11A and 11B illustrate further examples of the wireless device of FIG. 10, according to aspects of the present disclosure.
Figure 11B:
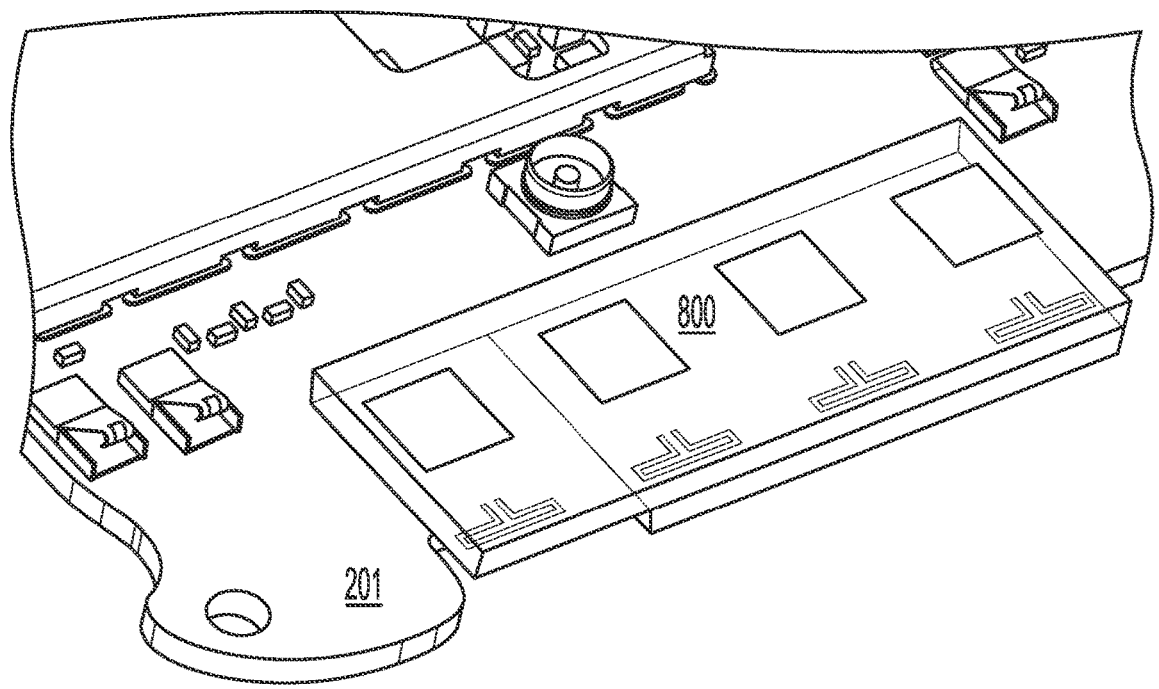

FIGS. 11A and 11B illustrate further examples of the wireless device 1000 of FIG. 10, according to aspects of the present disclosure. In these examples, the antenna module 800 is placed at a central region of the board 201 of the wireless device 1000 (FIG. 11A) and/or at an edge of the board 201 of the wireless device 1000 (FIG. 11B) using a direct connection 1102 to the board 201 (e.g., a board-to-board connector). Representatively, FIGS. 11A and 11B illustrate options for placing the antenna module 800 at multiple locations, which is important for better radiative coverage. This placement of each antenna module 800 may improve radiative energy, as measured by a cumulative distribution function (CDF). Although the antenna module 800 is shown using a board-to-board connector, those of skill in the art recognize that the antenna module 800 may be secured to the board 201 using a ball grid array (BGA) type connection including input/output (IO) and ground connections. While illustrated in FIG. 11A as including dipole antennas, the antenna module 800 may omit the dipole antennas.

Figure 12A:
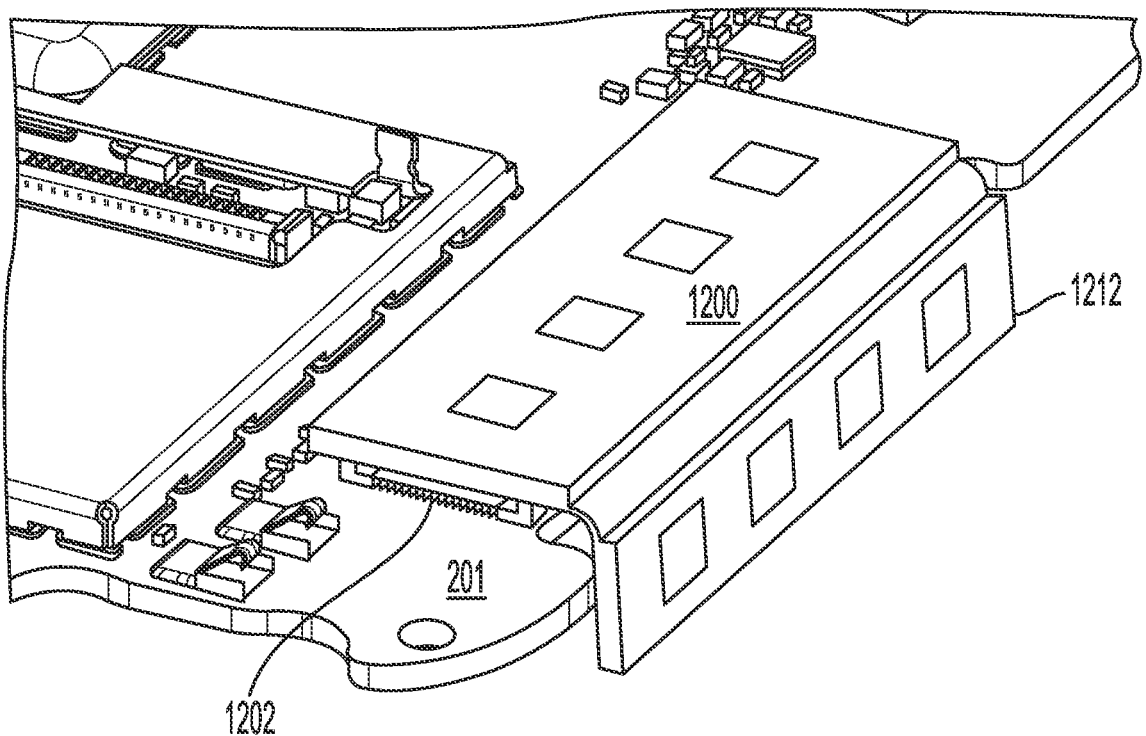
FIGS. 12A and 12B illustrate further examples of the wireless device of FIG. 10, according to aspects of the present disclosure.
Figure 12B:
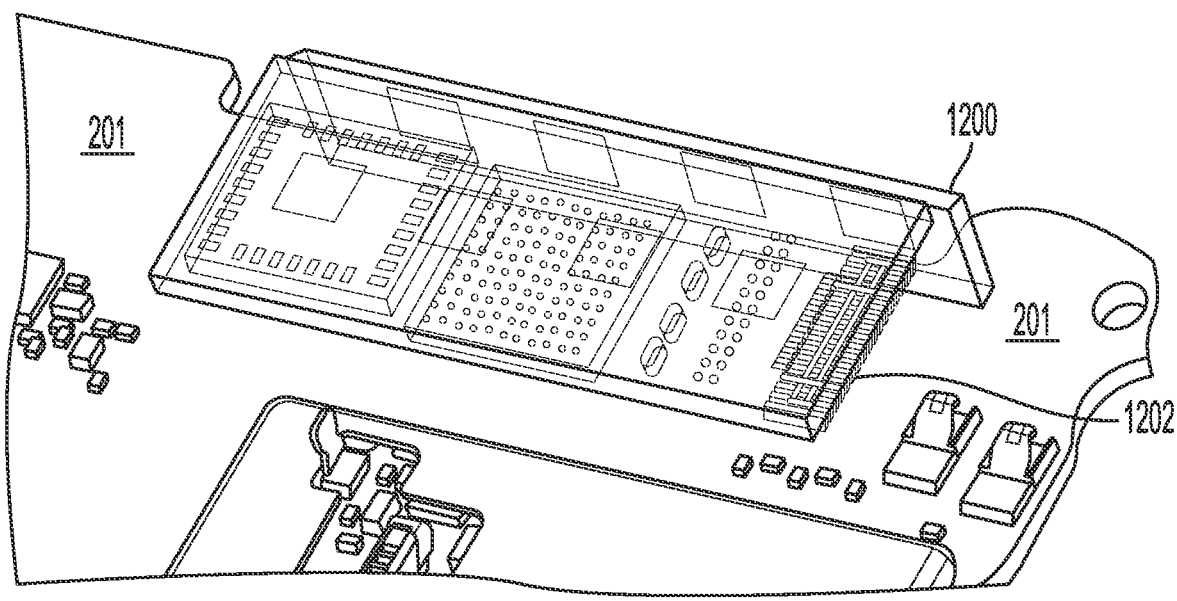

FIGS. 12A and 12B illustrate further examples of the wireless device 1000 of FIG. 10, according to aspects of the present disclosure. In these examples, the antenna module 800 is placed at the end of the board 201 of the wireless device 1000 using a direct connection 1202 to the board 201 (e.g., a board-to-board connector). Although the antenna module 800 is shown using a board-to-board connector, those of skill in the art recognize that the antenna module 800 may be secured to the board 201 using a ball grid array (BGA) type connection including input/output (IO) and ground connections. In this aspect of the present disclosure, the antennas 1212 (e.g., dipole antennas 812 and/or patch antennas 714) are flexibly connected to the antenna module 1200 (e.g., 800) to provide further flexibility for improving radiation from the antenna 1212. For example, when the antenna module 1200 is tilted with respect to the board 201, the antenna 1212 may be angled so as to radiate and/or receive from different directions. For example, when the antenna module 1200 is mounted roughly perpendicular to the board 201 (and therefore roughly perpendicular to a display (not shown) and/or backing (not shown) of the wireless device 1000), the patch antennas (e.g., 1212) may radiate and/or receive energy from a direction that is roughly perpendicular to such display and/or backing.

In one configuration, the antenna 1212 may be configured to radiate and/or receive out of the side of the wireless device 1000, or out of the top or bottom of the wireless device 1000. This may improve reception or transmission in certain circumstances, for example when a portion of a user's hand is covering all or part of the backing or display. For example, receiving from a direction that is approximately perpendicular to a side or top of a wireless device may improve reception when the user's hand is grasping the lower portion of the wireless device and/or when a user's face is against or near the display of the wireless device. Further, transmission in such circumstances using the configuration illustrated in FIG. 10 may increase the likelihood of adhering to specific absorption rate (SAR) and/or maximum permissible exposure (MPE) requirements.

In some configurations, antenna and/or RF elements may be implemented on the same board (for example, the board 201) as the baseband chip and/or transceiver chip of the transceiver elements 210 (and/or the RFIC 740). They may continue to be coupled together by the communications cable 250, but connectors may be omitted in some such configurations because a separate module including the antennas and/or RF elements is not implemented.

Figure 13A:
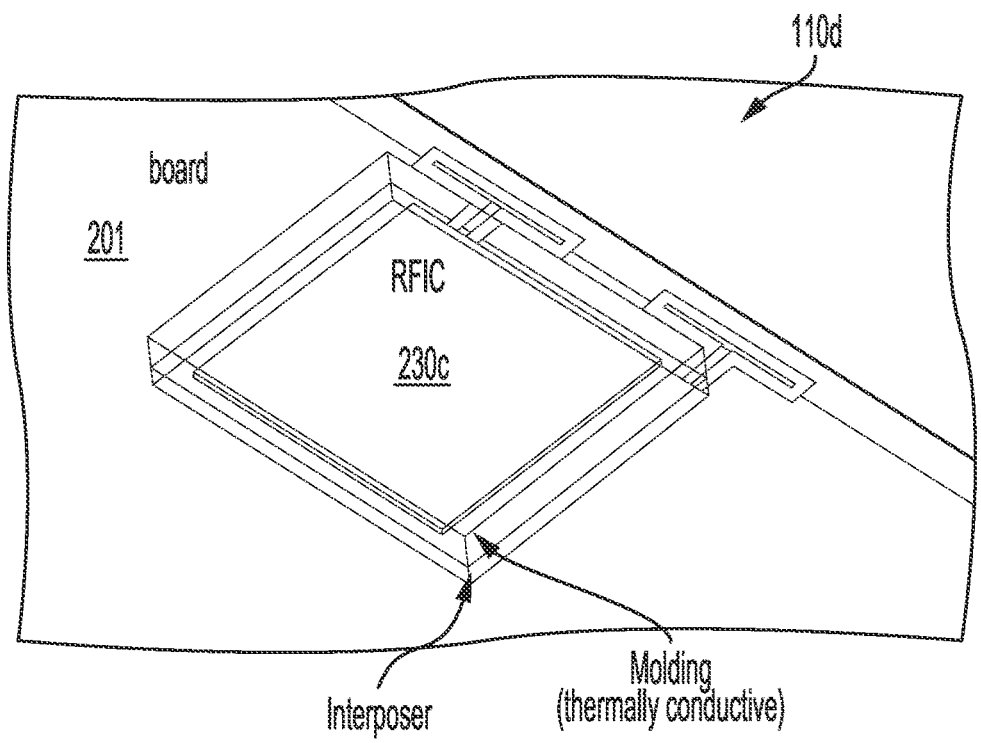
FIGS. 13A and 13B further illustrate a portion of the wireless device described in FIG. 1, according to aspects of the present disclosure.

FIG. 13A illustrates an example 110*d* of a portion of the wireless device 110 described in FIG. 1, according to aspects of the present disclosure. In FIG. 13A, an RFIC 230*c* is mounted on the board 201 using an interposer and a molding (which may, for example, be the non-metallized mold 830 and/or the metallized mold 832 and may abut a conductive wall 820). As can be seen in FIG. 13A, several antennas may be embedded in the board 201 as well. These antennas may include dipole antennas, as illustrated, and/or patch antennas (not visible). For example, patch antennas may be designed into the board 201 or on a separate module specific for patch antennas to which the interposer is attached. The interposer may attach to the separate patch antenna module, with both modules attached to the board 201.

In some configurations, there is a 2×2 array of patch antennas. There may be two dipole antennas extending adjacent to two respective patch antennas, as illustrated, or there may be four dipole antennas extending from three of the patch antennas. For example, in addition to the two dipole antennas illustrated in FIGS. 8A and 8B, there may two additional dipole antennas extending from an adjacent side, such that two dipole antennas are coupled near a patch at the corner, and one dipole antenna is coupled near each respective laterally spaced patch. Antenna impedance matching and/or routing may be included inside the interposer.

Figure 13B:
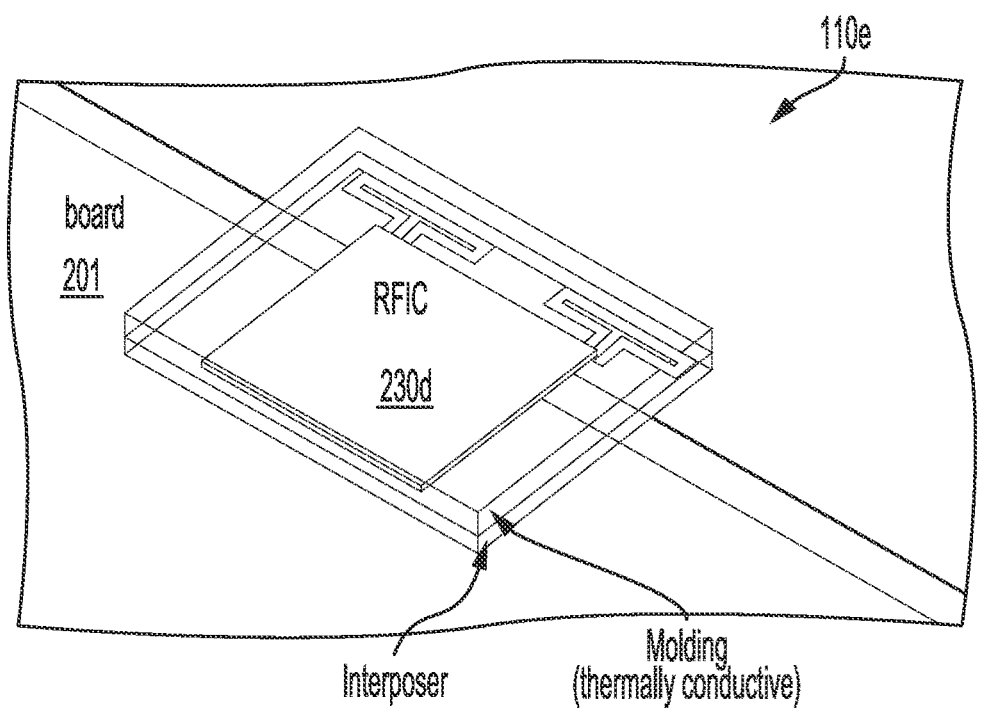

FIG. 13B illustrates an example 110*e* of a portion of the wireless device 110 described in FIG. 1, according to aspects of the present disclosure. In FIG. 13B, the interposer and dipole antennas hang over the edge of the board 201. In the configurations in FIG. 13B, the dipole antennas may extend into a side or top or bottom portion of the casing of the device 110*e*, for example, where there may be limited or previously unused space due to a curvature of the casing.

Figure 14:
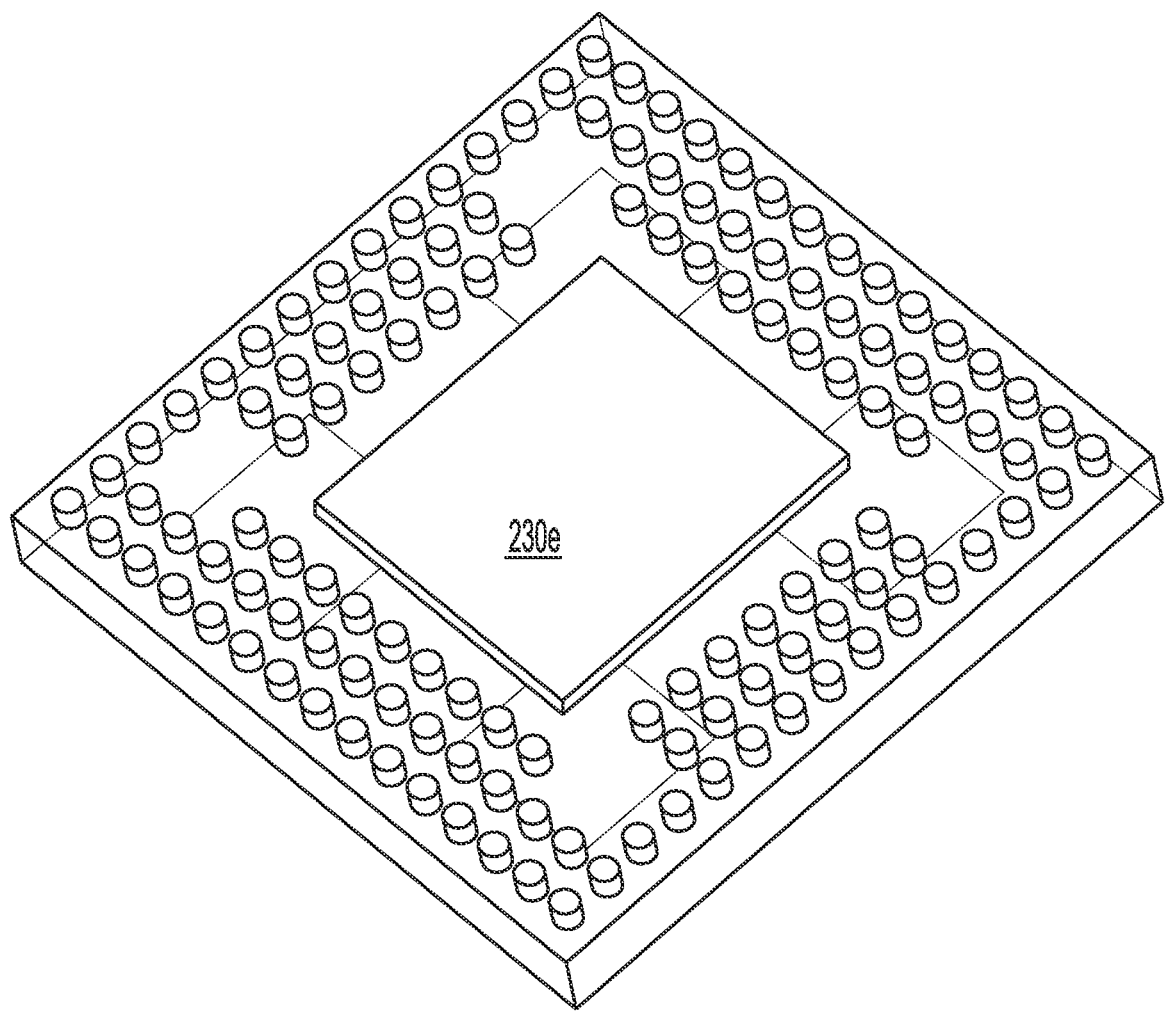
FIG. 14 illustrates an example apparatus that may be implemented with the devices illustrated in FIGS. 13A and 13B instead of using an interposer configuration, according to aspects of the present disclosure.

FIG. 14 illustrates an example apparatus that may be implemented with the device 110*d* and 110*e* illustrated in FIGS. 13A and 13B instead of using the interposer configuration, according to aspects of the present disclosure. In FIG. 14, a ball grid array (BGA) configuration is illustrated. An RFIC 230*e* is illustrated as being surround by balls (e.g., approximately 310 micrometers thick) on a board. An array of patch antennas (2×2 in the example illustrated in FIG. 13B) may further be implemented. As illustrated, dipole antennas may be omitted. In some configurations, dipole antennas may be coupled near one or more of the patch antennas. The board illustrated in FIG. 14 may be coupled to the board 201, for example, by one or more lines of the communications cable 250.

Figure 15:
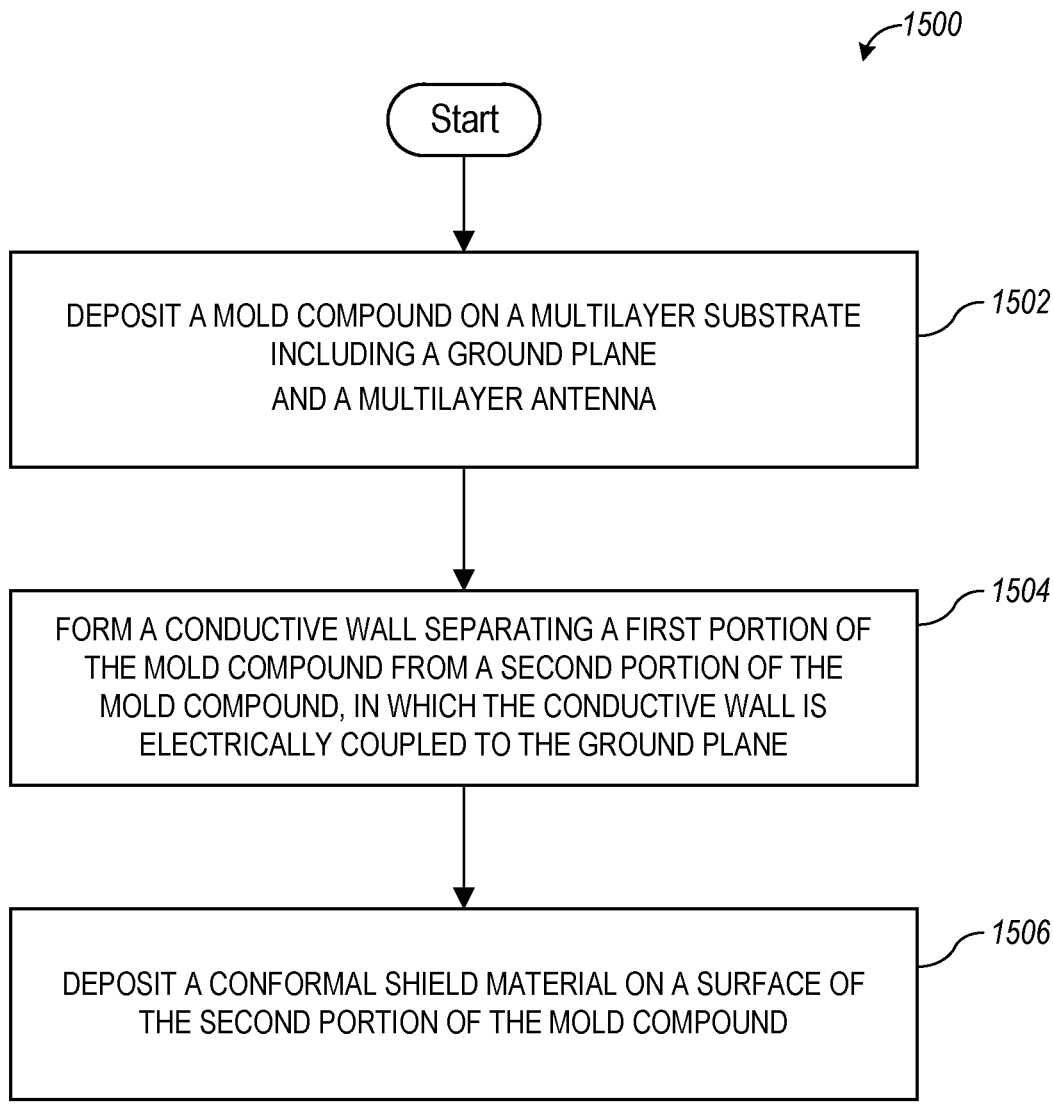
FIG. 15 is a flowchart illustrating a method of integrating a mold in an antenna module, in accordance with an aspect of the present disclosure.

FIG. 15 is a flowchart illustrating a method of integrating a mold in an antenna module, in accordance with an aspect of the present disclosure. A method 1500 begins at block 1502, in which a mold compound is deposited on a multilayer substrate including a ground plane and a multilayer antenna. For example, as shown in FIG. 7, the non-metallized mold 730 and the metallized mold 732 are deposited on the multilayer substrate 710. At block 1504, a conductive wall is formed to separate a first portion of the mold compound from a second portion of the mold compound, in which the conductive wall is electrically coupled to the ground plane. For example, as shown in FIG. 7, a mold may be deposited on the multilayer substrate 710 to encapsulate the RFIC 740 and the PMIC 750. The conductive wall 720 may be formed either before or after depositing of the mold. The conductive wall 720 separates a first portion of the mold from a second portion of the mold. Once the conformal shield 760 is deposited (as described below), the first portion of the mold may be referred to as the non-metallized mold 730 and the second portion of the mold may be referred to as the metallized mold 732.

Referring again to FIG. 15, at block 1506, a conformal shield material is deposited on at least a surface of the second portion of the mold compound. For example, as shown in FIG. 7, the conformal shield 760 is deposited on the metallized mold 732, an exposed portion of the conductive wall 720, a sidewall of the metallized mold 732, and a sidewall of the multilayer substrate 710. The conformal shield 760 may be composed of a conductive material, such as a sputtered conductive material (e.g., copper) on the portion of the surface of the metallized mold 732, a sidewall of the metallized mold 732, and a sidewall of the multilayer substrate 710. Although shown as separate steps, formation of the conductive wall 720 and depositing of the conformal shield 760 may be concurrently formed by using the same conductive material (e.g., sputtered copper (Cu) or copper paste).

According to a further aspect of the present disclosure, a 5G mmW antenna module or WLAN mmW antenna module is described. Such 5G mmW antenna module may include means for suppressing a lossy mold effect of a mold on a portion of the antenna module. The means for suppressing may, for example, include the conductive wall 720, as shown in FIG. 7. In another aspect, the aforementioned means may be any module, or any apparatus configured to perform the functions recited by the aforementioned means.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Several aspects of radio frequency (RF) communications systems were presented with reference to various apparatus and methods. These apparatus and methods described in the following detailed description and illustrated in the accompanying drawings by various blocks, modules, components, circuits, steps, processes, algorithms, etc. (collectively referred to as "elements"). These elements may be implemented using hardware, software, or combinations thereof. Whether such elements are implemented as hardware or software depends upon the particular application and design constraints imposed on the overall system.

By way of example, an element, or any portion of an element, or any combination of elements may be implemented with a "processing system" that includes one or more processors. Examples of processors include microprocessors, microcontrollers, digital signal processors (DSPs), field programmable gate arrays (FPGAs), programmable logic devices (PLDs), state machines, gated logic, discrete hardware circuits, and other suitable hardware configured to perform the various functionality described throughout this disclosure. One or more processors in the processing system may execute software. Software shall be construed broadly to mean instructions, instruction sets, code, code segments, program code, programs, subprograms, software modules, applications, software applications, software packages, firmware, routines, subroutines, objects, executables, threads of execution, procedures, functions, etc., whether referred to as software/firmware, middleware, microcode, hardware description language, or otherwise.

Accordingly, in one or more exemplary aspects, the functions described may be implemented in hardware, software, or combinations thereof. If implemented in software, the functions may be stored on or encoded as one or more instructions or code on a computer-readable medium. Computer-readable media includes computer storage media. Storage media may be any available media that can be accessed by a computer. By way of example, and not limitation, such computer-readable media can comprise RAM, ROM, EEPROM, PCM (phase change memory), flash memory, CD-ROM or other optical disk storage, magnetic disk storage or other magnetic storage devices, or any other medium that can be used to carry or store desired program code in the form of instructions or data structures and that can be accessed by a computer. Disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

Moreover, the term "or" is intended to mean an inclusive "or" rather than an exclusive "or." That is, unless specified otherwise or clear from the context, the phrase, for example, "X employs A or B" is intended to mean any of the natural inclusive permutations. That is, for example the phrase "X employs A or B" is satisfied by any of the following instances: X employs A; X employs B; or X employs both A and B. In addition, the articles "a" and "an" as used in this application and the appended claims should generally be construed to mean "one or more" unless specified otherwise or clear from the context to be directed to a singular form. A phrase referring to "at least one of" a list of items refers to any combination of those items, including single members. As an example, "at least one of: a, b, or c" is intended to cover: a, b, c, a-b, a-c, b-c, and a-b-c.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the term "some" refers to one or more. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims.

What is claimed is:

1. A device, comprising:
an antenna module comprising an integrated circuit configured to upconvert transmit signals to millimeter wave (mmW) signals for transmission and to downconvert received mmW signals, the antenna module further comprising an antenna array configured to transmit and receive mmW signals, the antenna array being coupled to the integrated circuit;
a plurality of antennas flexibly connected to the antenna module, the plurality of antennas configured to transmit and receive mmW signals; and
a connector coupled to the integrated circuit, the connector being configured to convey the transmit signals to the integrated circuit and to convey the downconverted received mmW signals away from the integrated circuit, wherein the connector comprises a plurality of pins, the plurality of pins comprising a first pin configured to couple a first transmit signal to the integrated circuit and a second pin configured to couple a second transmit signal to the integrated circuit.

2. The device of claim 1, wherein the antenna array comprises patch or dipole antennas and the plurality of antennas comprises patch or dipole antennas.

3. The device of claim 1, wherein the antenna array comprises phase array antennas.

4. The device of claim 1, wherein the integrated circuit is a radio frequency (RF) integrated circuit, and wherein the antenna module further comprises a power management integrated circuit configured to receive a supply voltage and convert the supply voltage into several different voltages for use by RF processing elements of the RF integrated circuit.

5. The device of claim 4, wherein the RF integrated circuit is implemented in an RF chip coupled to the power management integrated circuit.

6. The device of claim 1, wherein frequencies of the first and second transmit signals are in a range of approximately 6.9 GHz to 11 GHz.

7. The device of claim 1, wherein the connector is further configured to convey a local oscillator signal to the integrated circuit.

8. The device of claim 7, wherein the integrated circuit comprises circuitry configured to de-multiplex a combination of the local oscillator signal and one of the transmit signals.

9. The device of claim 1, wherein the connector is further configured to convey a control signal to the integrated circuit.

10. The device of claim 9, wherein the integrated circuit comprises circuitry configured to de-multiplex a combination of the control signal and one of the transmit signals.

11. The device of claim 1, wherein the antenna module further comprises a power management integrated circuit, and wherein the connector is further configured to convey a supply voltage to the power management integrated circuit.

12. The device of claim 1, wherein the antenna module comprises a mold and a conformal shield on a surface of at least a portion of the mold.

13. The device of claim 12, wherein the antenna module further comprises a ground plane and a conductive wall, the conductive wall separating a first portion of the mold from a second portion of the mold and being electrically coupled to the ground plane.

14. The device of claim 13, wherein a trench is formed between the conductive wall and the first portion or the second portion of the mold.

15. A device, comprising:
an antenna module comprising an integrated circuit configured to upconvert transmit signals to millimeter wave (mmW) signals for transmission and to downconvert received mmW signals, the antenna module further comprising an antenna array configured to transmit and receive mmW signals, the antenna array being coupled to the integrated circuit; and
a plurality of antennas flexibly connected to the antenna module, the plurality of antennas configured to transmit and receive mmW signals,
wherein the antenna module comprises a mold and a conformal shield on a surface of at least a portion of the mold.

16. The device of claim 15, wherein the antenna array comprises patch or dipole antennas and the plurality of antennas comprises patch or dipole antennas, and wherein the antenna array comprises phase array antennas.

17. The device of claim 15, wherein the integrated circuit is a radio frequency (RF) integrated circuit, wherein the antenna module further comprises a power management integrated circuit configured to receive a supply voltage and convert the supply voltage into several different voltages for use by RF processing elements of the RF integrated circuit, and wherein the RF integrated circuit is implemented in an RF chip coupled to the power management integrated circuit.

18. The device of claim 15, wherein the antenna module further comprises a connector coupled to the integrated circuit, the connector being configured to convey the transmit signals to the integrated circuit and to convey the downconverted received mmW signals away from the integrated circuit, and wherein the connector is further configured to convey a local oscillator signal to the integrated circuit.

19. The device of claim 15, wherein the antenna module further comprises a connector coupled to the integrated circuit, the connector being configured to convey the transmit signals to the integrated circuit and to convey the downconverted received mmW signals away from the integrated circuit, and wherein the connector is further configured to convey a control signal to the integrated circuit.

20. The device of claim 15, wherein the antenna module further comprises a connector coupled to the integrated circuit, the connector being configured to convey the transmit signals to the integrated circuit and to convey the downconverted received mmW signals away from the integrated circuit, wherein the antenna module further comprises a power management integrated circuit, and wherein the connector is further configured to convey a supply voltage to the power management integrated circuit.

* * * * *